United States Patent
Park et al.

(10) Patent No.: US 7,326,619 B2
(45) Date of Patent: Feb. 5, 2008

(54) METHOD OF MANUFACTURING INTEGRATED CIRCUIT DEVICE INCLUDING RECESSED CHANNEL TRANSISTOR

(75) Inventors: Jong-Chul Park, Gyeonggi-do (KR); Jun Seo, Gyeonggi-do (KR); Tae-Hyuk Ahn, Gyeonggi-do (KR); Hyuk-Jin Kwon, Gyeonggi-do (KR); Jong-Heui Song, Gyeonggi-do (KR); Dae-Keun Kang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 266 days.

(21) Appl. No.: 10/902,642

(22) Filed: Jul. 28, 2004

(65) Prior Publication Data

US 2005/0042833 A1 Feb. 24, 2005

(30) Foreign Application Priority Data

Aug. 20, 2003 (KR) .................. 10-2003-0057506
Dec. 17, 2003 (KR) .................. 10-2003-0092585

(51) Int. Cl.
*H01L 21/31* (2006.01)
*H01L 21/336* (2006.01)

(52) U.S. Cl. .................. 438/282; 257/E21.429; 257/E29.267

(58) Field of Classification Search .......... 438/282
See application file for complete search history.

(56) References Cited

U.S. PATENT DOCUMENTS

| 6,566,734 | B2 * | 5/2003 | Sugihara et al. | 257/616 |
| 2002/0094622 | A1 * | 7/2002 | Sneelal et al. | 438/197 |
| 2005/0035427 | A1 * | 2/2005 | Park et al. | 257/510 |

* cited by examiner

*Primary Examiner*—Alexander Ghyka
(74) *Attorney, Agent, or Firm*—Marger Johnson & McCollom, P.C.

(57) ABSTRACT

A method according to some embodiments of the invention includes defining an active region by forming a trench device isolation region on an integrated substrate, forming a mask pattern that exposes a channel sub-region of the active region and the trench device isolation region adjacent to the channel sub-region, etching the trench device isolation region, which is exposed by the mask pattern, to be recessed to a first depth using the mask pattern as an etch mask, etching the channel sub-region to form a gate trench having a second depth that is deeper than the first depth using the mask pattern as an etch mask, and forming a recess gate that fills the gate trench.

20 Claims, 22 Drawing Sheets

METHOD OF MANUFACTURING INTEGRATED CIRCUIT DEVICE INCLUDING RECESSED CHANNEL TRANSISTOR

CROSS REFERENCE TO RELATED APPLICATIONS

This application claims priority from Korean Patent Application No. 2003-57506, filed on 20 Aug. 2003, and from Korean Patent Application No. 2003-92585, filed on 17 Dec. 2003, the disclosures of which are incorporated by reference in their entirety for all purposes.

BACKGROUND OF THE INVENTION

1. Field of the Invention

This disclosure relates to a method of manufacturing an integrated circuit device, and more particularly, to a method of manufacturing an integrated circuit device that includes a recessed channel transistor.

2. Description of the Related Art

As the integration density of integrated circuit devices increases, new technical problems to be solved emerge. One of these problems is that the channel lengths of transistors are becoming shorter. In the case of a planarized transistor, a channel length of the transistor is reduced as the integration density increases often resulting in a short channel effect (SCE). The SCE causes a punch through problem between a source and a drain resulting in a malfunction of the integrated circuit device, thereby reducing reliability of the integrated circuit.

Several suggestions for solving the SCE problem have been presented such as using a SOI substrate instead of a bulk substrate, a method of modifying the transistor by using a Fin Field Effect Transistor (Fin FET), or manufacturing the transistor with a three dimensional shape having a recessed channel (hereinafter, a recessed channel transistor).

FIG. 1 is a plan diagram illustrating an active region pattern A/P for forming a conventional recessed channel transistor and a gate pattern G. FIGS. 2A, 2B, and 2C are cross-sectional diagrams illustrating the conventional recessed channel transistor taken along lines A-A', B-B', and C-C' in FIG. 1, respectively.

Referring to FIGS. 2A through 2C, a silicon substrate 10 is divided into a trench isolation region 40a and an active region defined by the trench isolation region 40a. A gate trench 90 is formed in the active region. A recess gate 98 buried in the gate trench 90 and source and drain regions 50 formed on both side of the recess gate 98 constitute a recessed channel transistor. A channel of the recessed channel transistor is formed along the sides and bottom of the gate trench 90; in FIG. 2A, the channel is formed from left to right, and in FIG. 2C, the channel is formed from front to rear. Accordingly, since the channel length of the recessed channel transistor is longer than that of a planarized transistor, problems associated with the short channel length can be reduced or solved.

However, as shown in the dotted circles in FIG. 2C, in the conventional recessed channel transistor a portion of the silicon substrate 10 referred to as a silicon fence remains between a side wall of the trench isolation region 40a and a side wall of the gate trench 90.

The silicon fence occurs because a vertical profile of the trench isolation region 40a has a predetermined slope close to the edge of the active region pattern A/P. The active region pattern A/P, defined by the trench isolation region 40a, has a narrower upper width d1 than a lower width d2 due to limitations of the dry etching process. That is, when etching the silicon substrate to form a trench, the side walls of the gate trench 90 have a predetermined slope. When forming the gate trench 90, in spite of efforts to form vertical side walls by etching the silicon substrate using an anisotropic dry etching method, it is unavoidable that a portion of the silicon substrate, that is, the silicon fence remains, on the lower edge of the active region.

Because of the silicon fence, the channel length of the recessed channel transistor in the central region of the active region pattern (refer to FIG. 2A) and in the edge of the active region pattern (refer to FIG. 2B) are different. When there is an especially short channel region in the recessed channel transistor, the threshold voltage of the transistor is not only reduced but a malfunction of the integrated circuit device results from a sub-threshold leakage current through the region. Moreover, when the silicon fence exists in the source and drain region, a short circuit between the source region and the drain region can occur.

SUMMARY OF THE INVENTION

Some embodiments of the invention provide a method of manufacturing an integrated circuit device including a recessed channel transistor in which a gate trench with a planarized bottom is formed by preventing the formation of a silicon fence. Other embodiments provide a method of manufacturing an integrated circuit device including a recessed channel transistor in which a defect on an upper edge of an active region is prevented.

BRIEF DESCRIPTION OF THE DRAWINGS

The above and other features and advantages of the present invention will become more apparent by describing in detail preferred embodiments thereof with reference to the attached drawings.

DETAILED DESCRIPTION OF THE INVENTION

Figure 1:
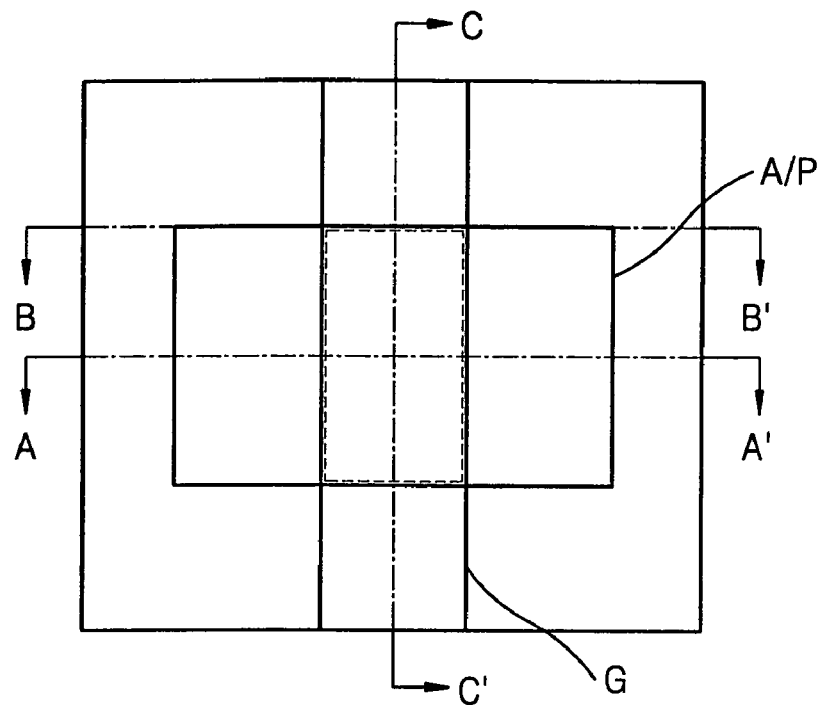
FIG. 1 is plan diagram illustrating a conventional recessed channel transistor.
Figure 2A:
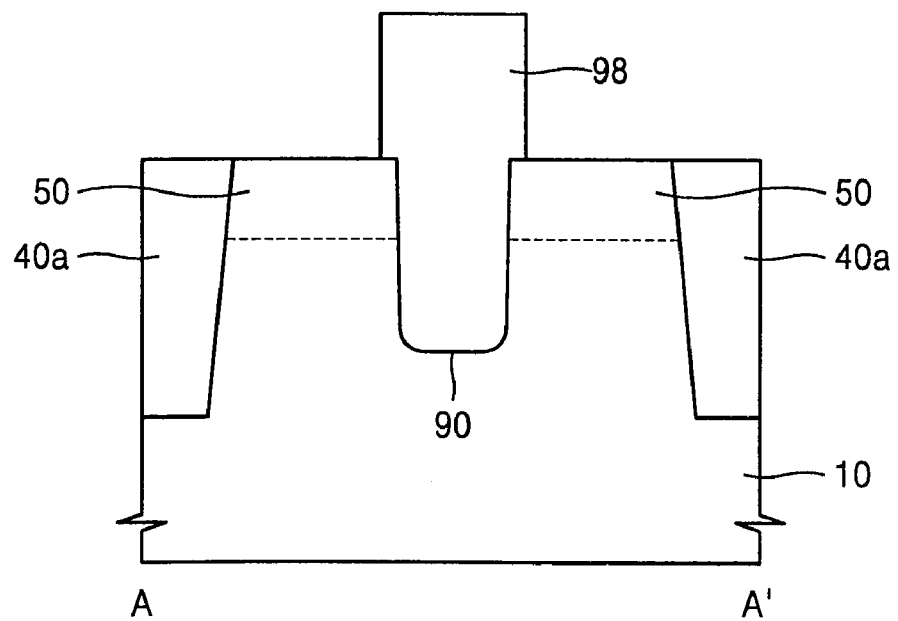
FIGS. 2A, 2B, and 2C are cross-sectional diagrams illustrating a conventional recessed transistor, taken along lines A-A', B-B', and C-C' of FIG. 1, respectively.
Figure 2B:
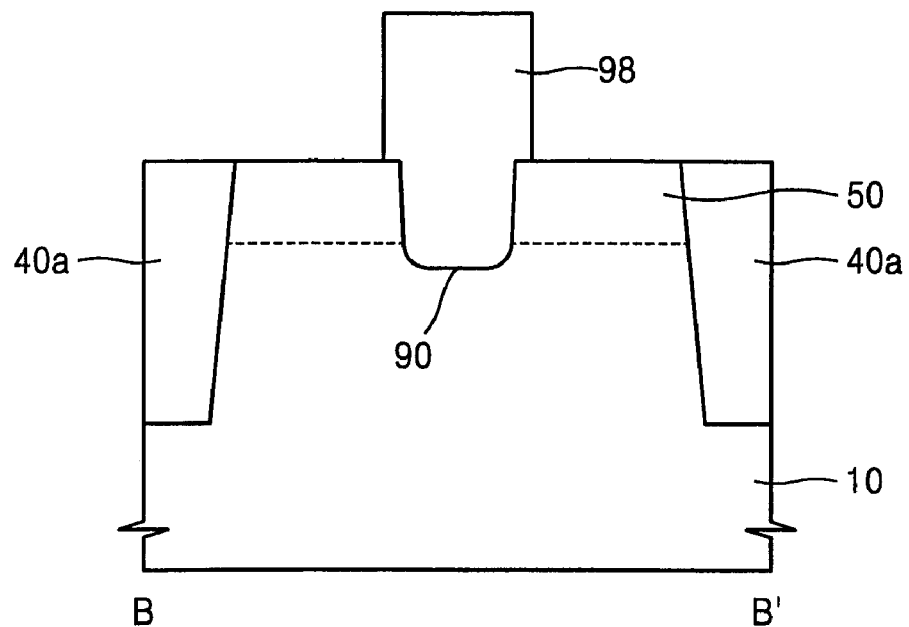
Figure 2C:
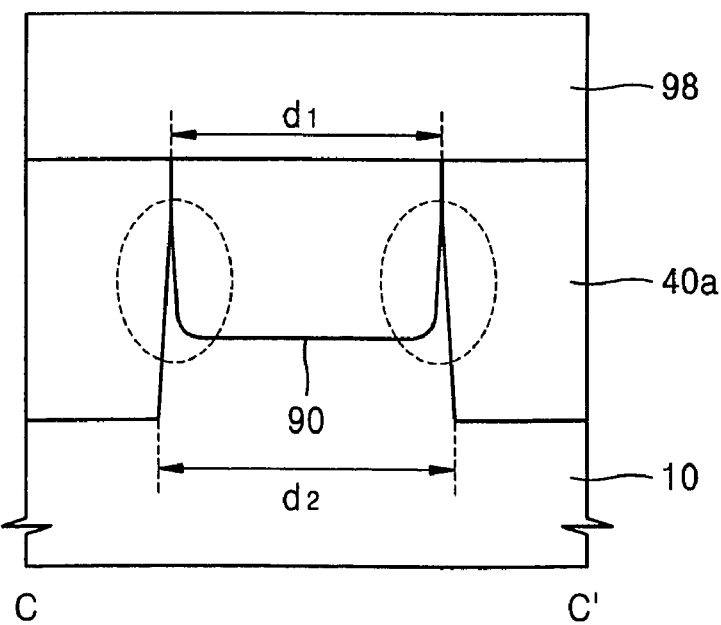

Hereinafter, the invention will be described more fully with reference to the accompanying drawings in which exemplary embodiments of the invention are shown. This invention may be, however, be embodied in many different forms and should not be construed as being limited to the embodiments set forth herein. Rather, these embodiments are provided so that this disclosure is thorough and complete and fully conveys the concept of the invention to those skilled in the art. In the drawings, the thicknesses of films or regions may be exaggerated for clarity. Like reference numerals refer to like elements throughout the drawings.

Figure 3A:
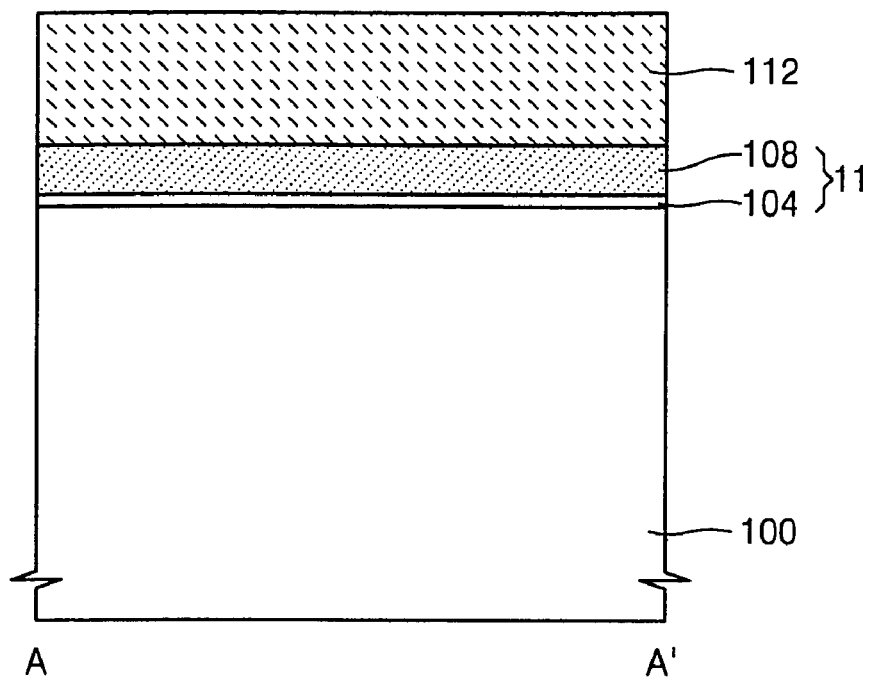
FIGS. 3A through 14B are cross-sectional diagrams illustrating a method of manufacturing a recessed transistor according to some embodiments of the invention.
Figure 3B:
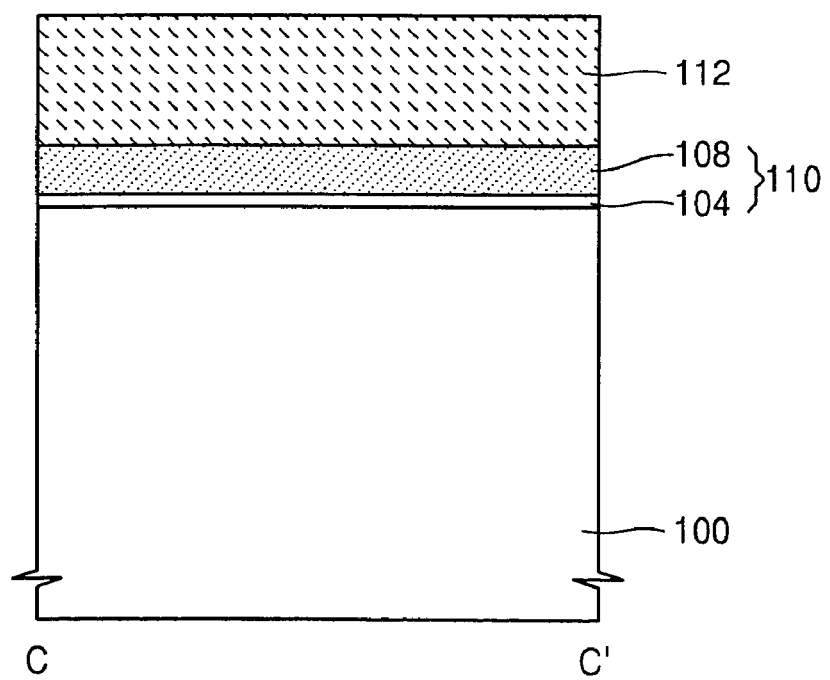
Figure 4A:
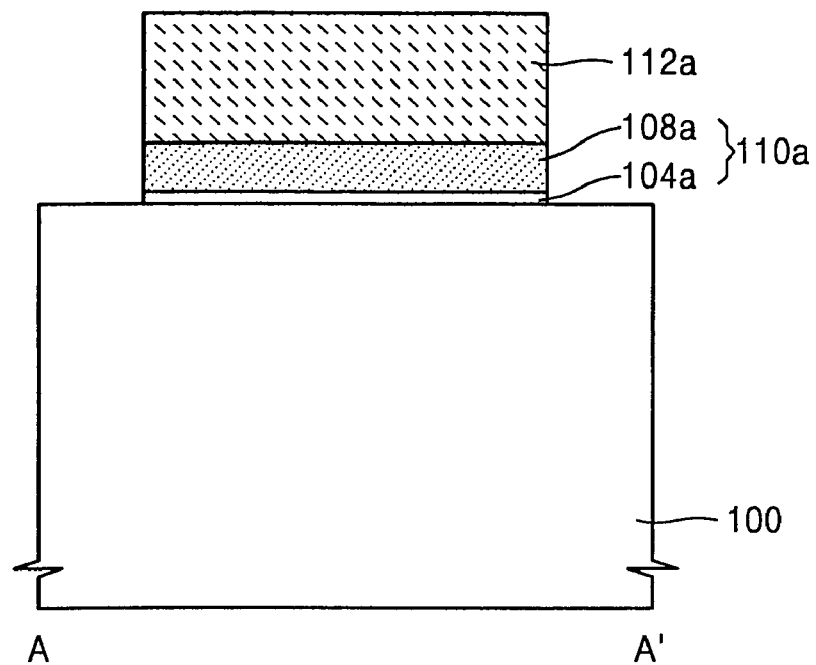
Figure 4B:
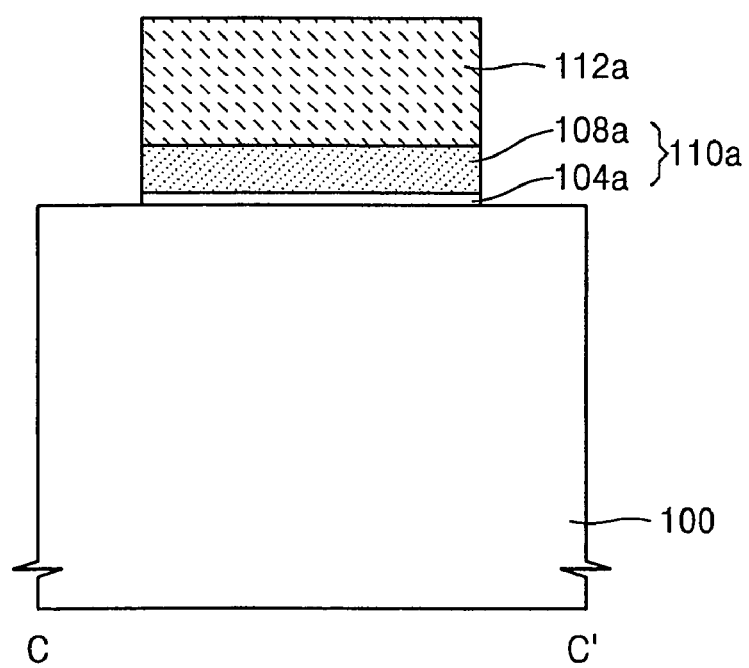

FIGS. 3A and 3B through 14A and 14B are cross-sectional diagrams illustrating a method of manufacturing a recessed transistor of an integrated circuit device according to some embodiments of the invention. FIGS. 3A, 4A, . . . 13A, and 14A are cross-sectional diagrams taken along the line A-A'. FIGS. 3B, 4B, . . . 13B, and 14B are cross-sectional diagrams taken along the line C-C'. Lines A-A' and C-C' in the embodiments illustrated in FIGS. 3-14 correspond to lines A-A' and C-C', respectively, of the conventional recessed transistor of FIG. 1.

Referring to FIGS. 3A and 3B, a pad insulating film 110 is formed by sequentially forming an oxide film 104 and a nitride film 108 on a substrate 100. An anti-reflection coating (ARC) (not shown) and a photoresist 112 are formed on the pad insulating film 110. The oxide film 104, which reduces stress between the substrate 100 and the nitride film 108, is formed to a thickness of about 100 Å. The nitride film 108, which is used as an etch mask for forming a STI region, is formed by depositing silicon nitride to a thickness of about 800~850 Å.

Referring to FIGS. 4A and 4B, a photoresist pattern 112a that defines an active region is formed. A pad mask 110a, which includes a nitride film pattern 108a and a thermal oxide film pattern 104a, is formed by patterning the pad insulating film 110 using the photoresist pattern 112a as a mask. A carbon fluoride gas such as $C_xF_x$ gas, or a $C_aH_bF_c$ gas, i.e., $CF_4$, $CHF_3$, $C_2F_6$, $C_4F_8$, $CH_2F_2$, $CH_3F$, $CH_4$, $C_2H_2$, $C_4F_6$, or a mixture of these gases is used for etching the nitride film 108. At this time, argon is used as the atmosphere gas.

Figure 5A:
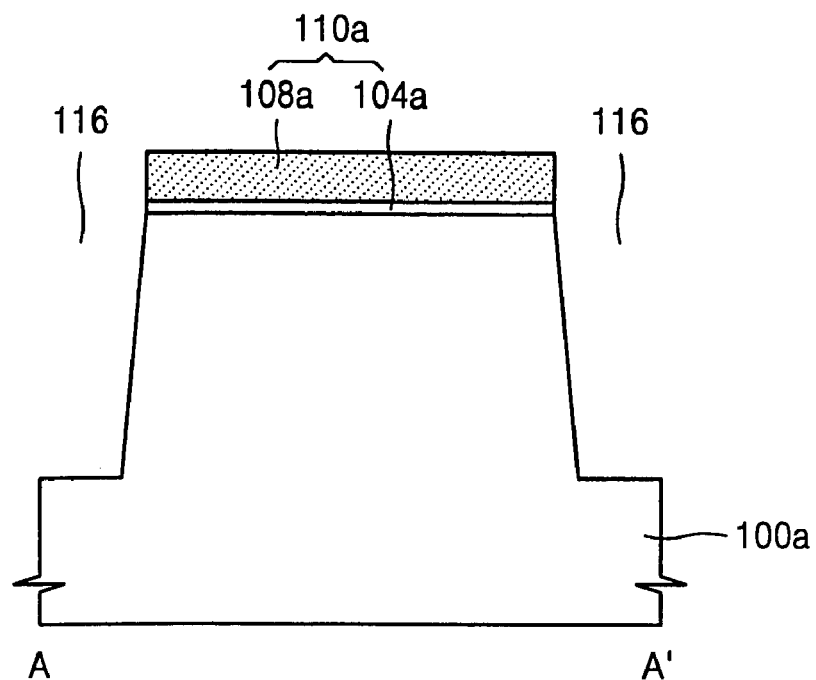
Figure 5B:
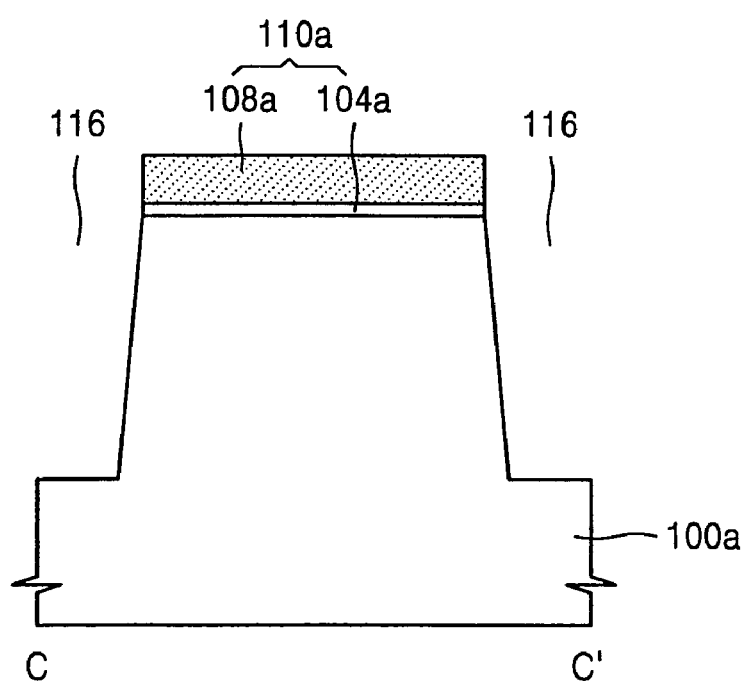

Referring to FIGS. 5A and 5B, after removing the photoresist pattern 112a, a trench 116 that defines an active region is formed by anisotropic dry etching an exposed portion of the substrate 100 using the pad mask 110a as an etch mask. The photoresist pattern 112a can be removed by a conventional method, such as organic stripping, after ashing using oxygen plasma. The trench 116 is preferably formed with an aspect ratio small enough that a void is not formed when the trench 116 is filled with an insulating film in a subsequent process. When the trench is filled with a high density plasma (HDP) oxide film, the trench is preferably formed with an aspect ratio of less than 3.0.

Figure 6A:
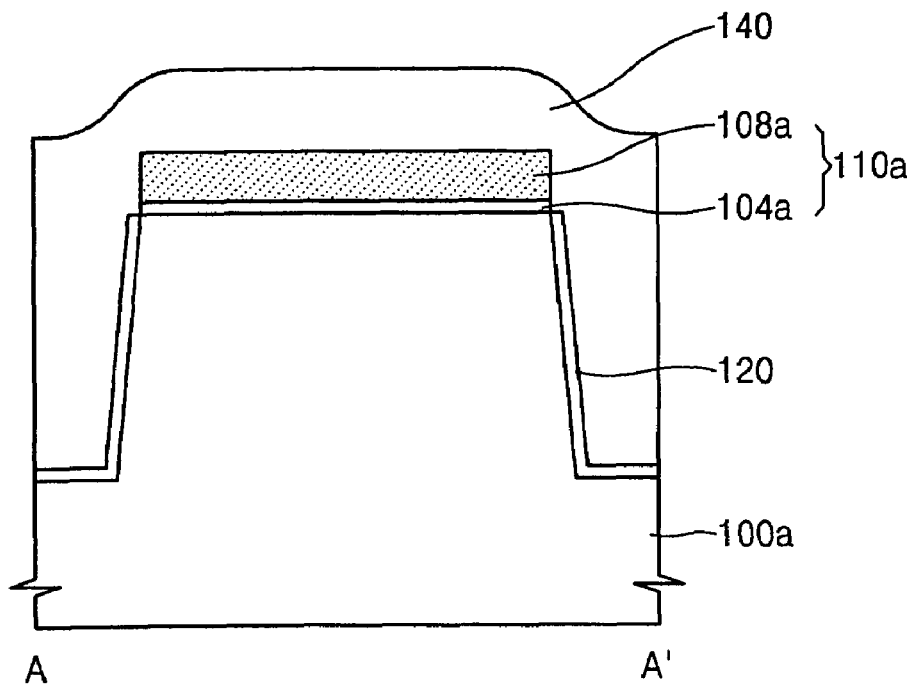
Figure 6B:
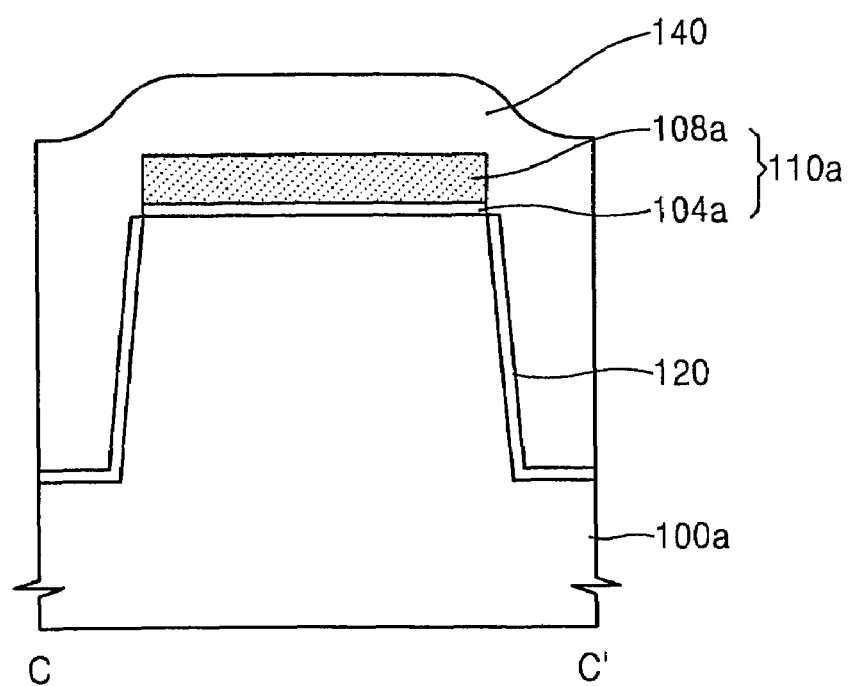

Referring to FIGS. 6A and 6B, an inner wall of the trench 116 is protected by forming an insulating film 120 on an entire surface of the resultant product in which the trench 116 is formed. The insulating film 120 can be a single layer oxide film or a multiple layer oxide film with an oxide/nitride/oxide structure. The trench 116 is then filled with an insulating film. The insulating film can be a film selected from the group consisting of a USG film, an HDP oxide film, a TEOS film formed by PECVD, an oxide film formed by PECVD, or a combination of these films. The HDP oxide film 140 is more preferable for filling the trench 116. In an HDP CVD process, which is a combination of CVD and a sputtering method, a deposition gas for depositing a material film and a sputtering gas for etching the deposited material film are supplied to a process chamber. That is, $SiH_4$ gas and oxygen are supplied to the process chamber as the deposition gas, and an inert gas such as argon is supplied to the process chamber as the sputtering gas. Portions of the supplied deposition gas and the sputtering gas are ionized in the chamber by plasma generated by RF power. Biased high frequency power is applied to a wafer chuck (electrostatic chuck) in which the substrate is loaded, and the ionized deposition gas and the sputtering gas are accelerated toward a surface of the substrate. The accelerated deposition gas ions form a silicon oxide film, and the accelerated sputtering gas ions sputter the deposited silicon oxide film. Because the deposition process proceeds in this manner, an upper surface of the HDP oxide film 140 has a shape as depicted in FIGS. 6A and 6B.

Figure 7A:
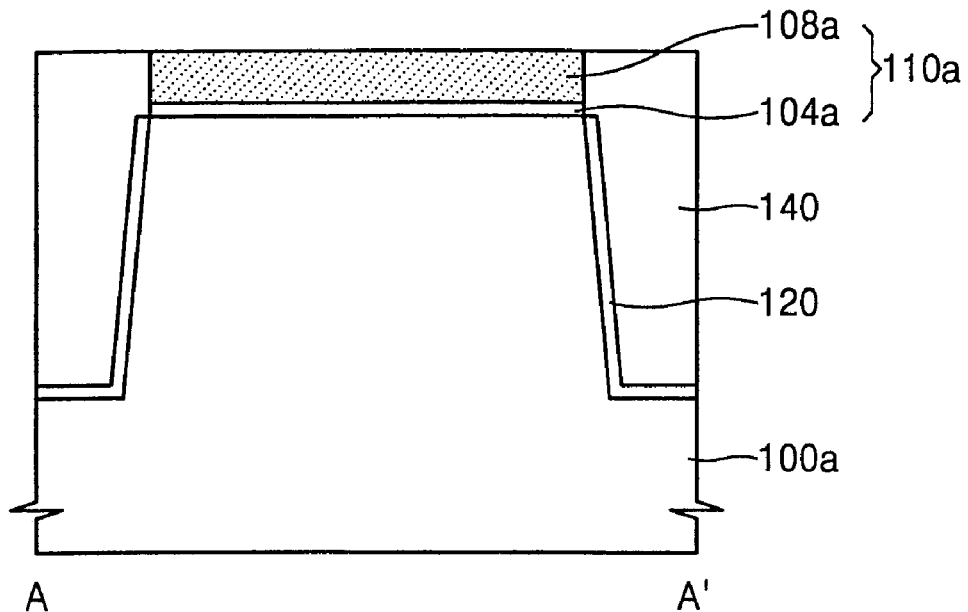
Figure 7B:
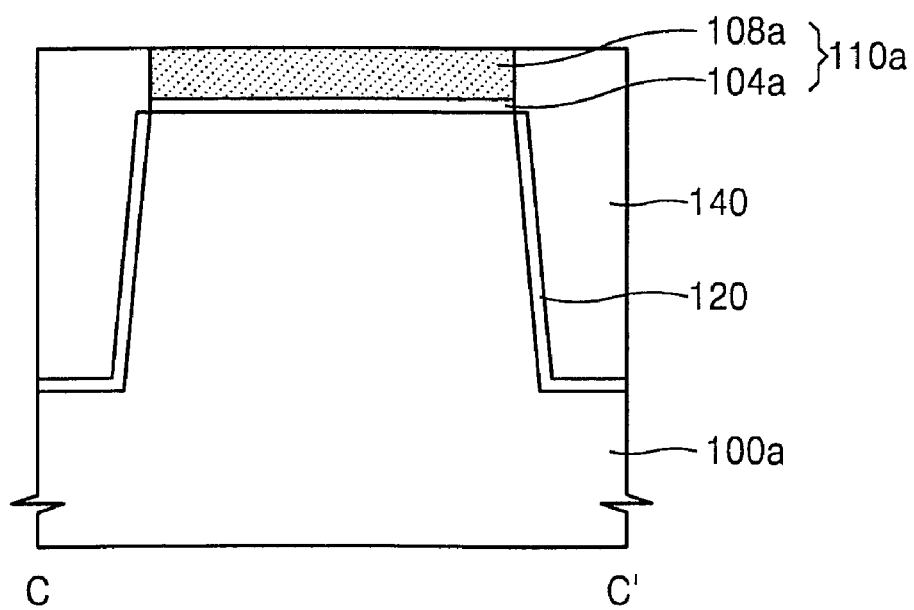

Referring to FIGS. 7A and 7B, the insulating film 140 is planarized until an upper surface of the insulating film is at substantially the same level as an upper surface of the pad mask 110a. The HDP oxide film 140 can be planarized by a chemical mechanical polishing (CMP) method or by an etch back method. The nitride film pattern 108a is used as a stopping layer in the planarizing process. The nitride film pattern 108a performs as a CMP stopper layer when the HDP oxide film 140 is planarized by CMP. A slurry used for the CMP is preferably a slurry that can etch the HDP oxide film 140 faster than the nitride film pattern 108a. For example, a slurry that includes a polishing agent from the ceria group can be used.

Figure 8A:
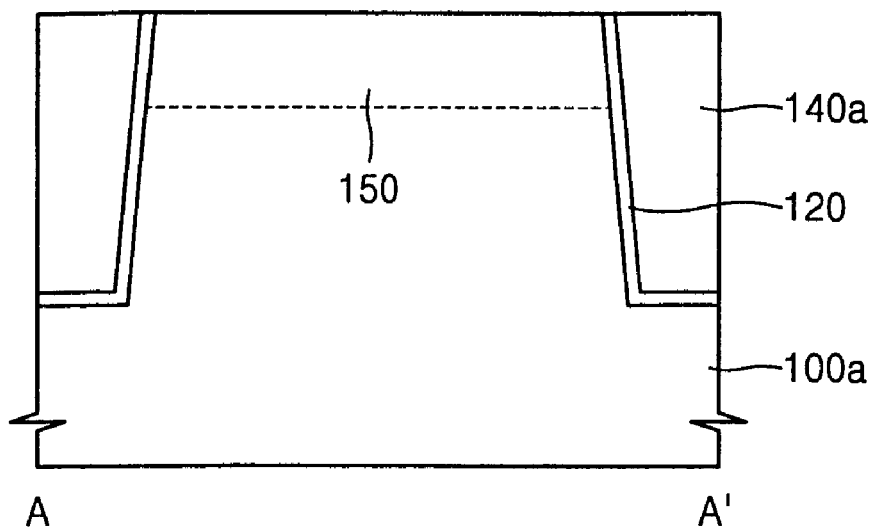
Figure 8B:
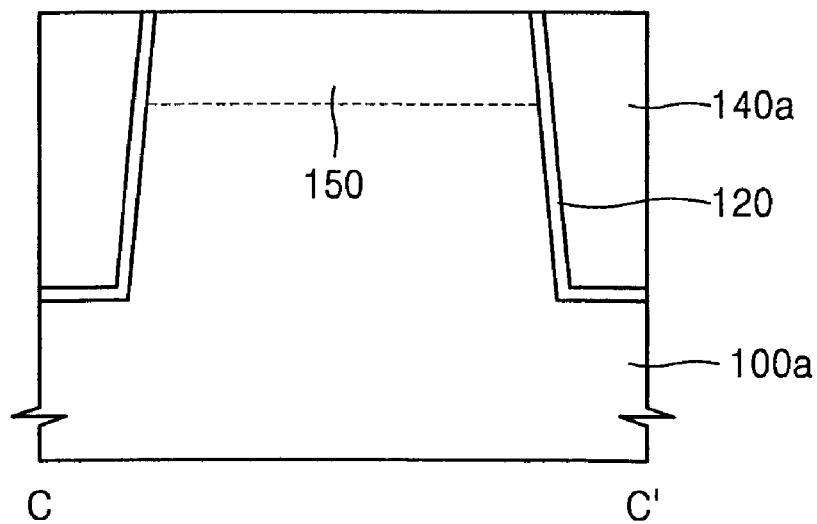

Referring to FIGS. 8A and 8B, an STI region 140a is formed by removing the pad mask 110a. The nitride film pattern 108a of the pad mask 110a is removed using a phosphoric acid strip, and the thermal oxide film pattern 104a is removed by HF or a buffered oxide etchant (BOE). Then, a source/drain region 150 is formed by implanting a dopant having a conductivity type opposite the conductivity type of the substrate 100 on a surface of the substrate 100 where the STI region 140a is formed. For example, a N-type dopant may be implanted on a surface of a P-type substrate.

Figure 9A:
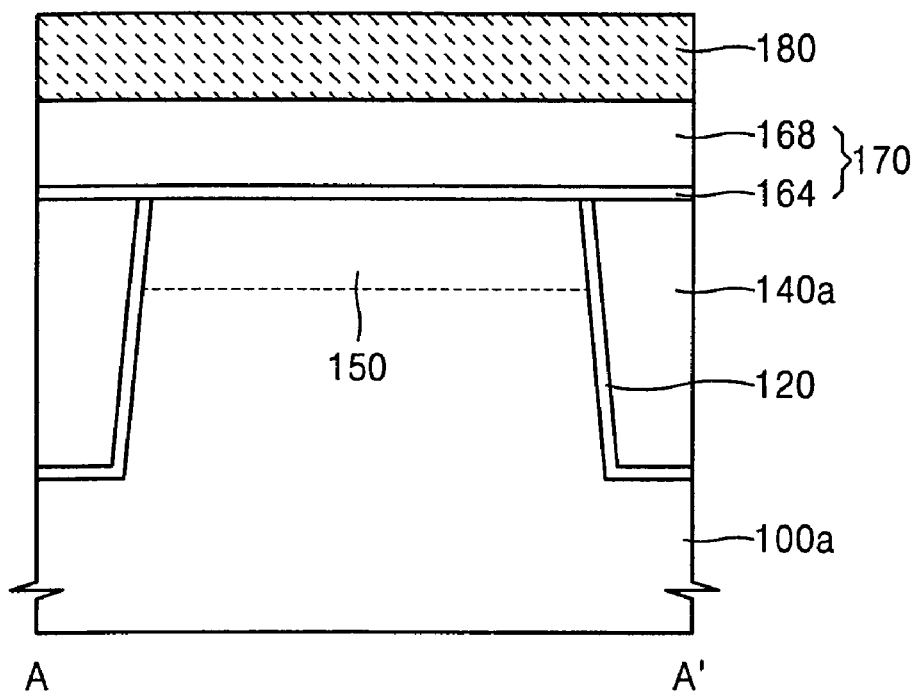
Figure 9B:
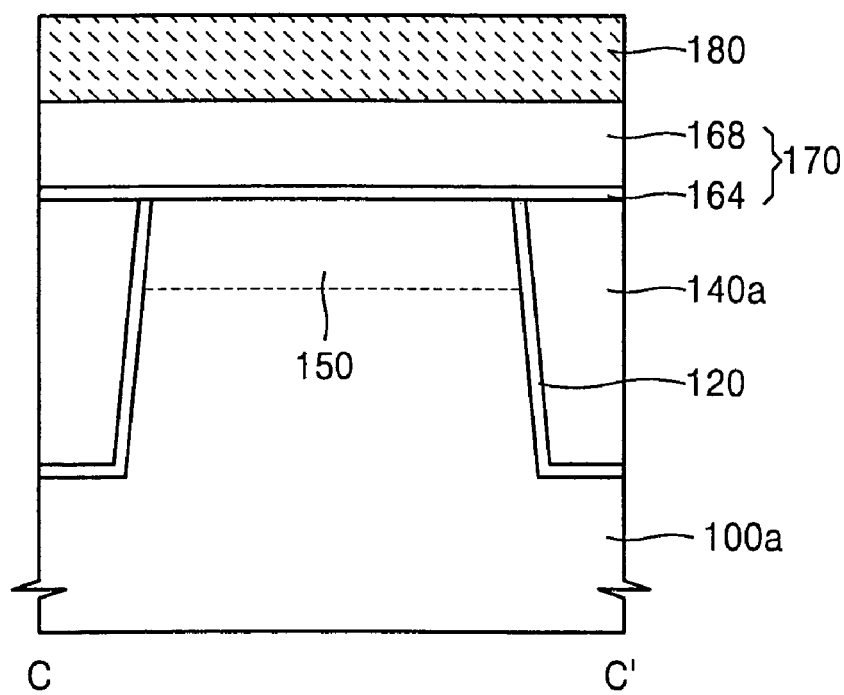

Referring to FIGS. 9A and 9B, a hard mask film 170 is formed by sequentially depositing a thermal oxide film 164 and a polysilicon film 168 on the STI region 140a and the source/drain region 150. An organic ARC film (not shown) and a photoresist 180 are then deposited on the hard mask film 170. Considering an etch stopping function, the thermal oxide film 164 is preferably formed of a middle temperature oxide (MTO) formed using $SiH_4$, $Si_2H_6$, and $N_2O$ as a reaction gas. The MTO film can be formed to a thickness of about 200 Å. The polysilicon film 168 may be formed to a thickness of about 1,000 Å using $N_2$ and $SiH_4$ as a reaction gas. The thermal oxide film 164 and the polysilicon film 168 can be formed by CVD, SACVD, LPCVD, or PECVD, but LPCVD is preferred.

Figure 10A:
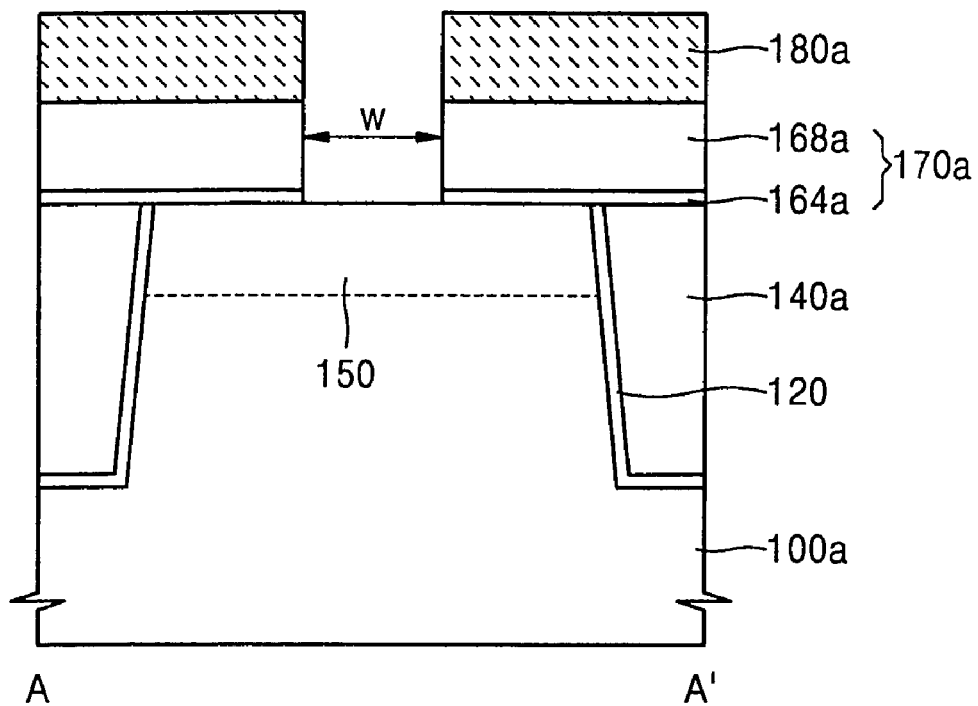
Figure 10B:
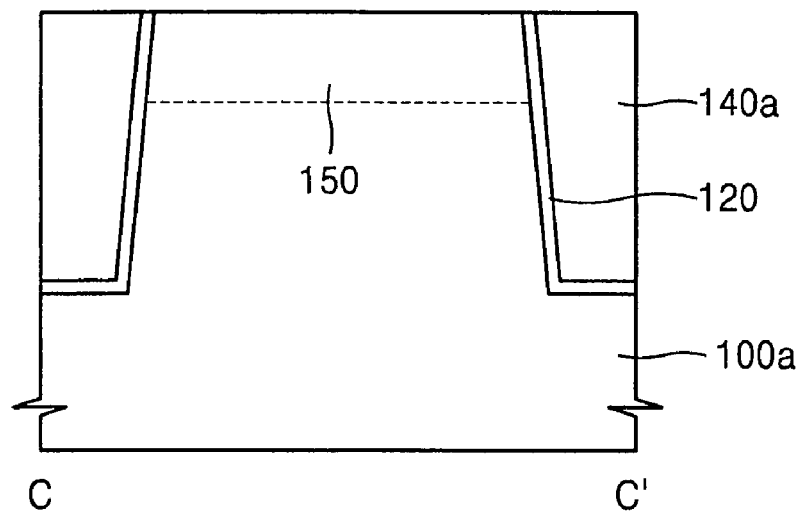

Referring to FIGS. 10A and 10B, a photoresist pattern 180a for defining a gate trench is formed using an exposing and developing process. In this case, the photoresist pattern 180a can be formed in a line-type pattern that extends in a lengthwise direction (C-C' direction) which is the same direction as that of a gate electrode which will be formed in a subsequent process. A hard mask 170a composed of a polysilicon film pattern 168a and a thermal oxide film pattern 164a is formed by anisotropic dry etching the hard mask film 170 using the photoresist pattern 180a as a mask. The hard mask 170a is also formed in a line-type pattern extended in the lengthwise direction. A channel sub-region of the active region and a trench device isolation region adjacent to the channel sub-region are exposed by the hard mask 170a. The channel sub-region is a region for forming a gate trench of the active region. The polysilicon film 168 may be etched using HBr, $Cl_2$, $CClF_3$, $CCl_4$, or $SF_6$ as a main etching gas. The thermal oxide film 164 may be etched using a carbon fluoride gas. A width W of the gate trench defined by the hard mask 170a is about 50~100 nm.

Figure 11A:
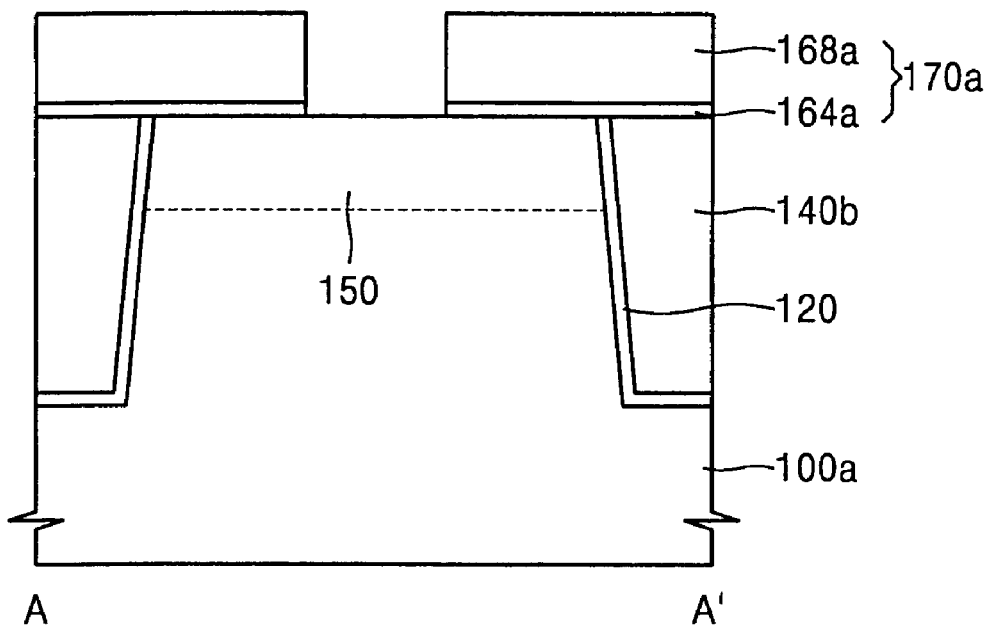
Figure 11B:
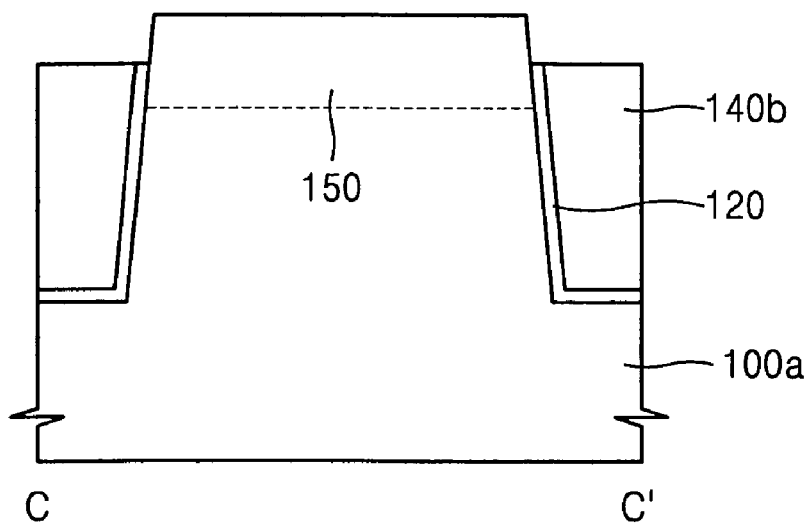

Referring to FIGS. 11A and 11B, a recessed STI region 140b is formed by anisotropic dry etching the exposed STI region 140a, i.e., a device isolation region, using the hard mask 170a as an etch mask after removing the photoresist pattern 180a. For etching the STI 140a, an oxide film etchant having a large etch selectivity for the hard mask 170a and the substrate 100 is used as an etching gas. As a result, a portion of side surface of the substrate 100 on which a gate trench will be formed is exposed by the hard mask 170a and the recessed STI region 140b.

In the process for forming the recessed STI region 140b, an etching depth of the insulating film is preferably determined according to a depth of a gate trench 190 to be formed in a subsequent process considering an etch profile at the bottom of the gate trench 190. It is preferable that the insulating film is etched to a depth of about 300~500 Å when the gate trench is formed to a depth of about 1,500 Å.

Figure 12A:
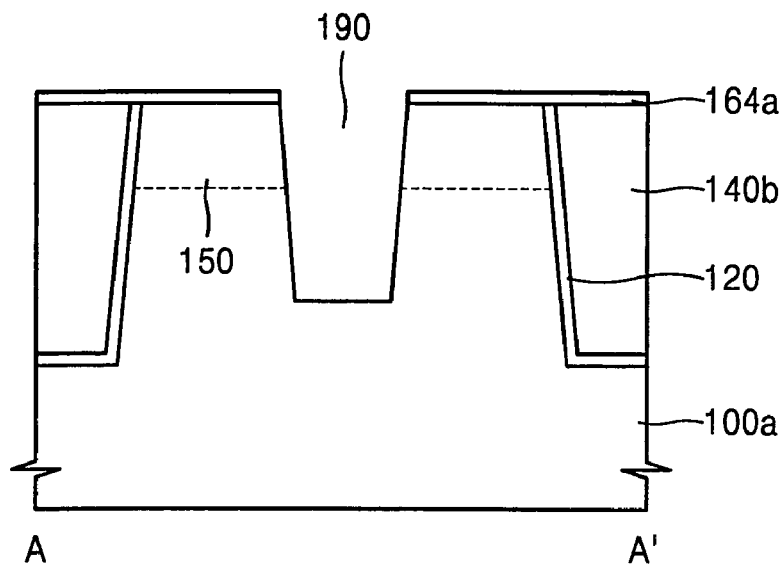
Figure 12B:
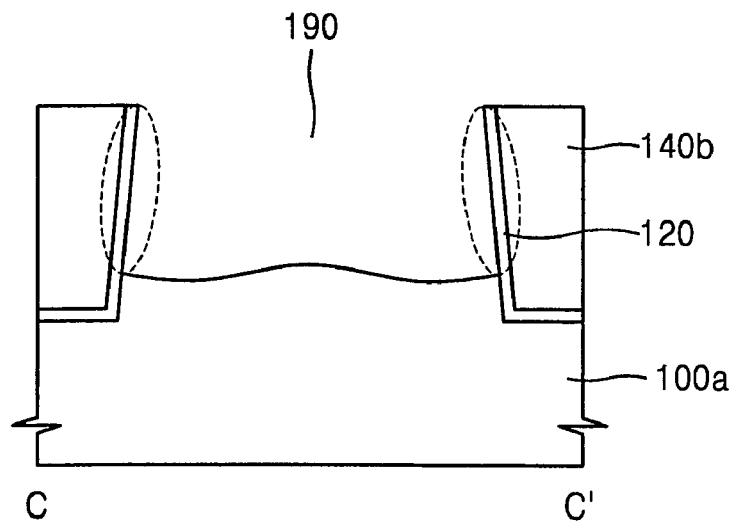
Figure 15A:
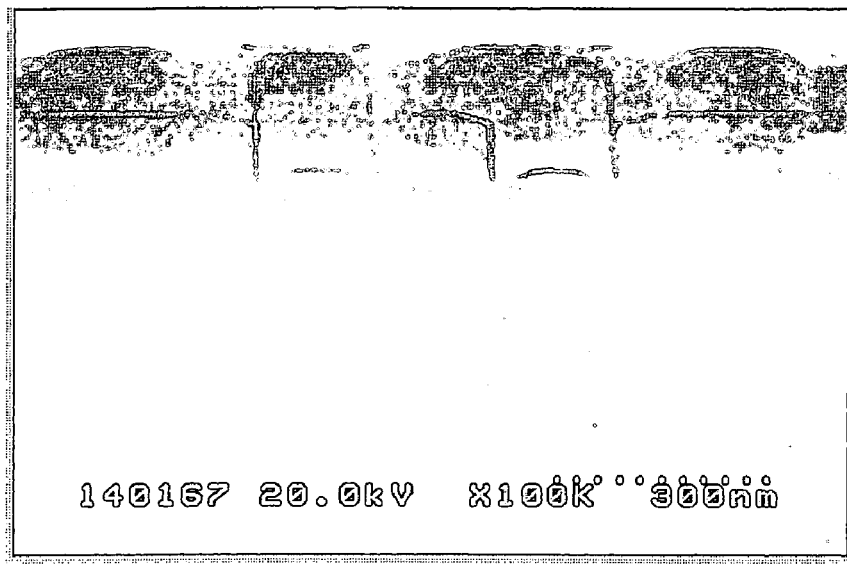
FIG. 15A is a Scanning Electron Microscope (SEM) image of an integrated circuit device manufactured according to the embodiments of the invention illustrated in FIGS. 3A through 14B, a channel sub-region of which is partially etched by an anisotropic dry etching method.

Referring to FIGS. 12A and 12B, the gate trench 190 is formed by anisotropic dry etching an exposed protion of the substrate 100 using the hard mask 170a as an etch mask. The gate trench 190 is formed to a greater depth than the source/drain region 150. Preferably, the gate trench 190 is formed to a depth of about 1,500 Å. It is also preferable that the polysilicon film pattern 168a of the hard mask 170a be removed simultaneously with the etching of the substrate 100 for forming the gate trench 190. In this case, an upper surface of the thermal oxide film pattern 164a is used as an etch stopper. Therefore, the gate trench 190 is formed by reactive ion etching (RIE) using an etching gas such as HBr, $Cl_2$, $CClF_3$, $CCl_4$, or $SF_6$, which are used for etching polysilicon or silicon that has a large etch selectivity with respect to the thermal oxide film pattern 164a. A preferred etching gas is a mixture of HBr and $Cl_2$. When etching the substrate 100 by anisotropic etching, the exposed upper surface and side surfaces of the substrate 100 are etched simultaneously because a portion of the side surfaces of the substrate 100 are exposed when forming the recessed STI region 140b. That is, etching progresses along the side surfaces of the substrate 100 at an angle slightly off vertical. This is different from the conventional etching in which the etching progresses only in a vertical direction. As a result, in the early stage of etching for forming the gate trench 190, a boundary region (dotted regions in FIG. 12B) of the gate trench 190 near a side wall of the recessed STI region 140a is etched deeper than a central region of the gate trench 190. FIG. 15A is a SEM image showing the etching profile at the early stage of etching.

When the etching is continued, a height of the substrate 100 becomes less than that of the recessed STI region 140b, thus the exposed side surfaces of the substrate 100 disappear, and the STI region 140b has a slight slope. Therefore, the etching of the substrate 100 progresses more actively in the central region than in the boundary region of the gate trench 190. After forming the gate trench 190, a planarized bottom profile of the gate trench 190 is achieved.

Figure 15B:
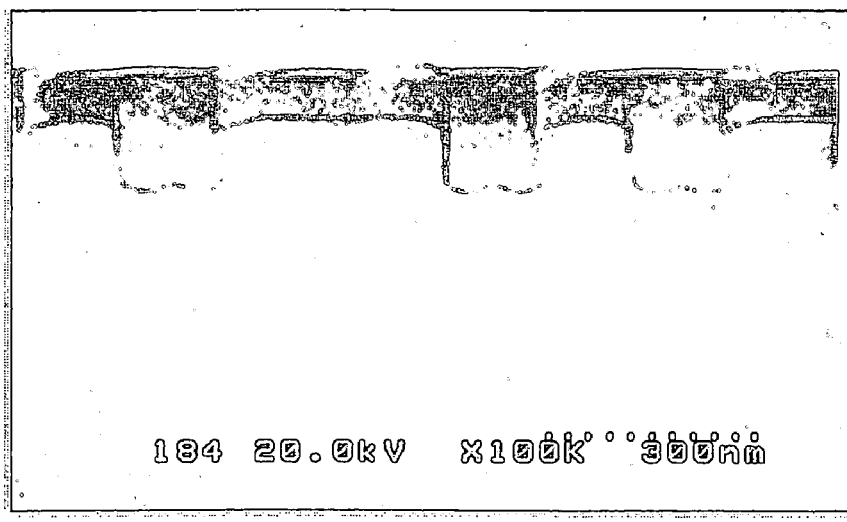
FIG. 15B is a SEM image of an integrated circuit device manufactured according to the embodiments of the invention illustrated in FIGS. 3A through 14B, a channel sub-region of which is completely etched by an anisotropic dry etching method.

The etching is stopped when the planarized bottom profile of the gate trench 190 is formed. In this case, a substrate region (silicon fence) does not exist between a side wall of the gate trench 190 and a side wall of the recessed STI region 140b, and a portion with a shorter channel length than the other portions in the active region is not formed since the bottom of the gate trench 190 is substantially planarized. FIG. 15B is a SEM image showing the etching profile described above. The depth (300~500 Å as mentioned earlier) of the insulating film 120 used to form the recessed STI region 140b is determined such that the etching profile is planarized at a depth of the gate trench 190 to be formed.

Figure 13A:
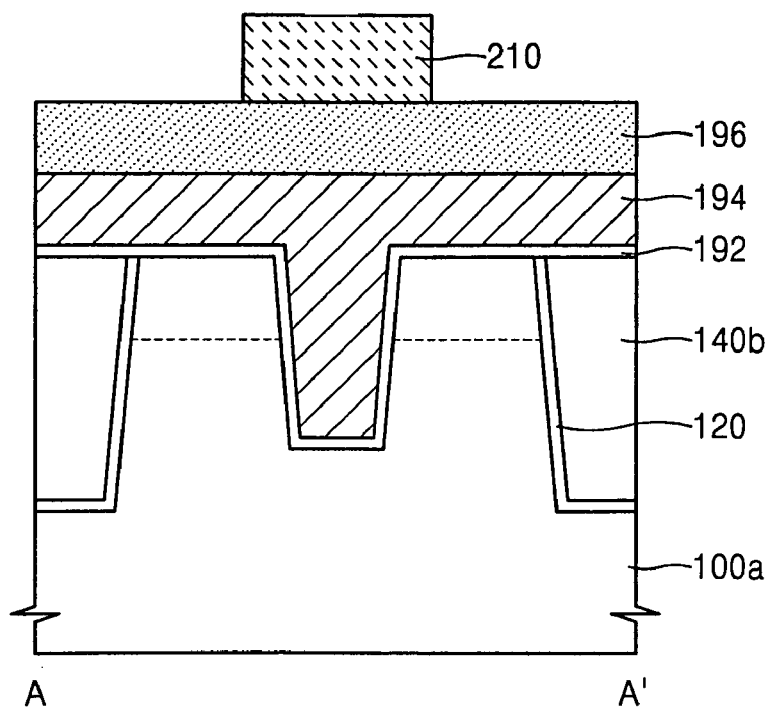
Figure 13B:
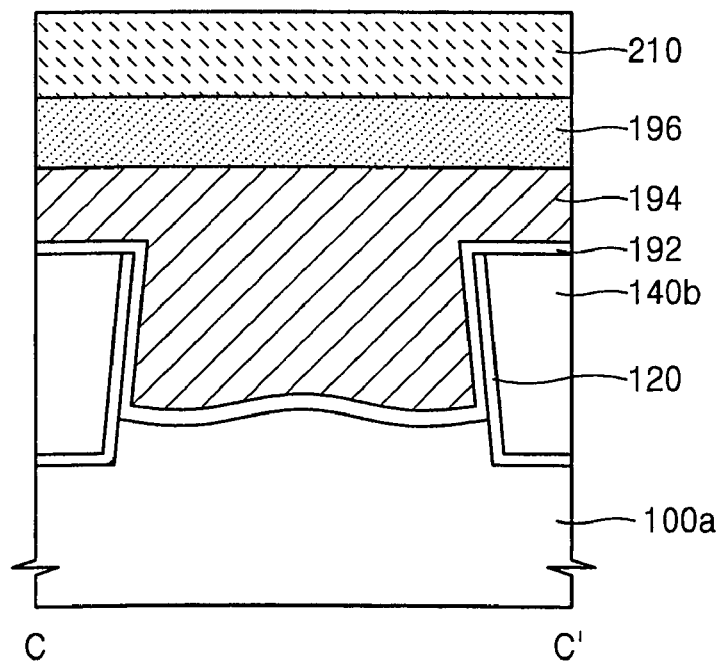

Referring to FIGS. 13A and 13B, a gate oxide film 192 is formed after removing the thermal oxide film pattern 164a. The thermal oxide film 164a can be removed using hydrogen fluoride (HF) or a buffer oxide etchant (BOE). The gate oxide film 192 can be formed to a thickness of about 40 Å or less. The gate oxide film 192 can be formed by dry oxidation using oxygen at a temperature of about 1000~1100° C., wet oxidation using vapor at a temperature of about 1000~1100° C., HCl oxidation using a gaseous mixture of oxygen and HCl, an oxidation using a gaseous mixture of oxygen and $C_2H_3Cl_3$, or oxidation using a gaseous mixture of oxygen and $C_2H_2Cl_2$. Next, the gate trench 190 is filled by forming a gate electrode conductive film 194. The gate electrode conductive film 194 may be a doped polysilicon film, a metal film, a sequentially deposited doped polysilicon film and a metal film, or a sequentially deposited doped polysilicon film and a metal silicide film. The metal film can be formed of a metal selected from the group consisting of tungsten, cobalt, and nickel, and the metal silicide can be a tungsten silicide film or a cobalt silicide film. The doped polysilicon film is formed by LPCVD using $SiH_2Cl_2$ and $PH_3$ gas. The tungsten silicide film is formed by LPCVD using $SiH_2Cl_2$ and $WF_6$ gas. A nitride film 196 is formed on the gate electrode conductive film 194. A photoresist pattern 210 that defines an ARC (not shown) and a gate electrode are formed on the nitride film 196.

Figure 14A:
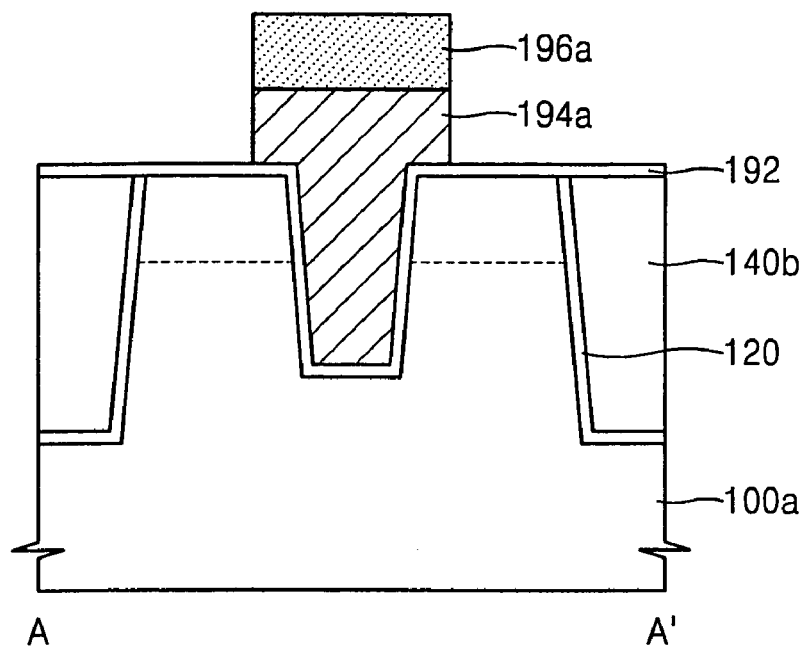
Figure 14B:
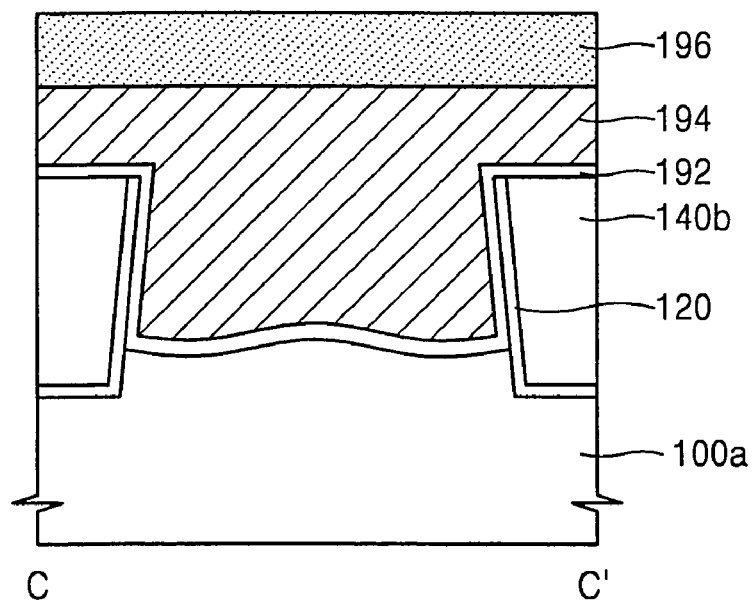

Referring to FIGS. 14A and 14B, gate electrodes 194a and 196a are formed by sequentially etching the ARC, the nitride film 196, and the gate electrode conductive film 194 by dry etching using the photoresist pattern 210 as an etch mask. Then, the photoresist pattern 210 is removed, and the integrated circuit device may then be completed using conventional processes.

Figure 16A:
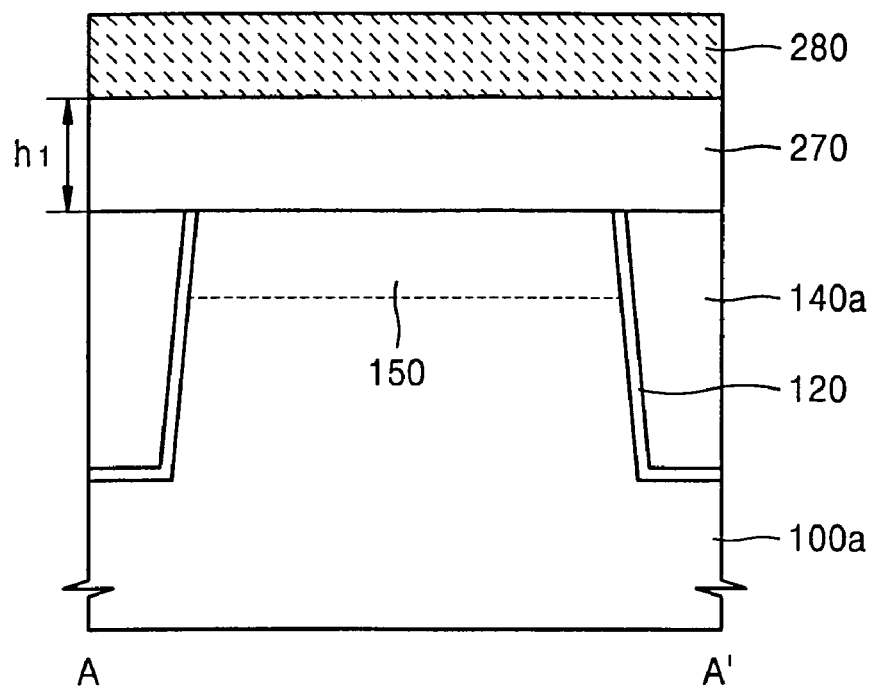
FIGS. 16A through 22B are cross-sectional diagrams illustrating a method of manufacturing a recessed transistor according to some other embodiments of the invention.
Figure 16B:
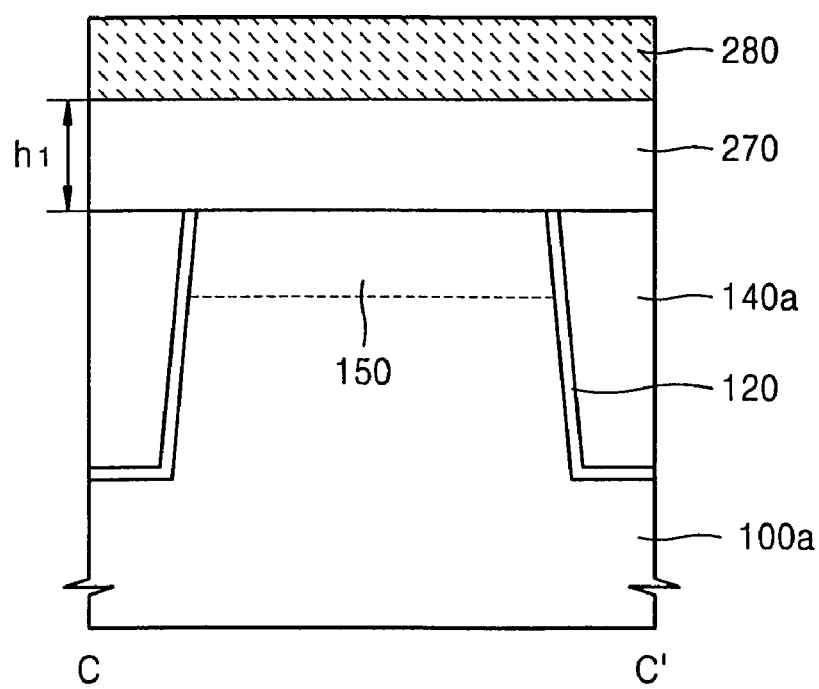

FIGS. 16A and 16B through 22A and 22B are cross-sectional diagrams illustrating a method of manufacturing a recessed transistor of an integrated circuit device according to some other embodiments of the invention. FIGS. 16A, 17A, . . . 21A, and 22A are cross-sectional diagrams taken along the line A-A'. FIGS. 16B, 17B, . . . 21B, and 22B are cross-sectional diagrams taken along the line C-C'. Lines A-A' and C-C' in the embodiments illustrated in FIGS. 16-22 correspond to lines A-A' and C-C', respectively, of the conventional recessed transistor of FIG. 1.

Referring to FIGS. 16A and 16B, a substrate 100 on which an STI region 140a and a source/drain region 150 are defined is prepared. The STI region 140a and the source/drain region 150 can be formed using the same method as was described above with reference to FIGS. 3-14.

An insulating film 270 is formed on the substrate 100. The insulating film 270 can be formed of silicon oxide, such as an oxide film selected from the group consisting of a USG film, an HDP oxide film, a TEOS films or a combination of these oxide films. When considering etch stopping function, the insulating film 270 is preferably a middle temperature oxide (MTO) formed using $SiH_4$, $Si_2H_6$, and $N_2O$ as a reaction gas. When the insulating film is an oxide film, the STI region 140a can be recessed by wet etching in connection with a cleaning process, which will be described later. A thickness h1 of the insulating film 270 is preferably large considering the function of a mask pattern and an etch amount in a wet etching process. The insulating film 270 can be formed to a thickness of about 400~700 Å. An organic ARC film (not shown) and a photoresist 280 are formed on the insulating film 270.

Figure 17A:
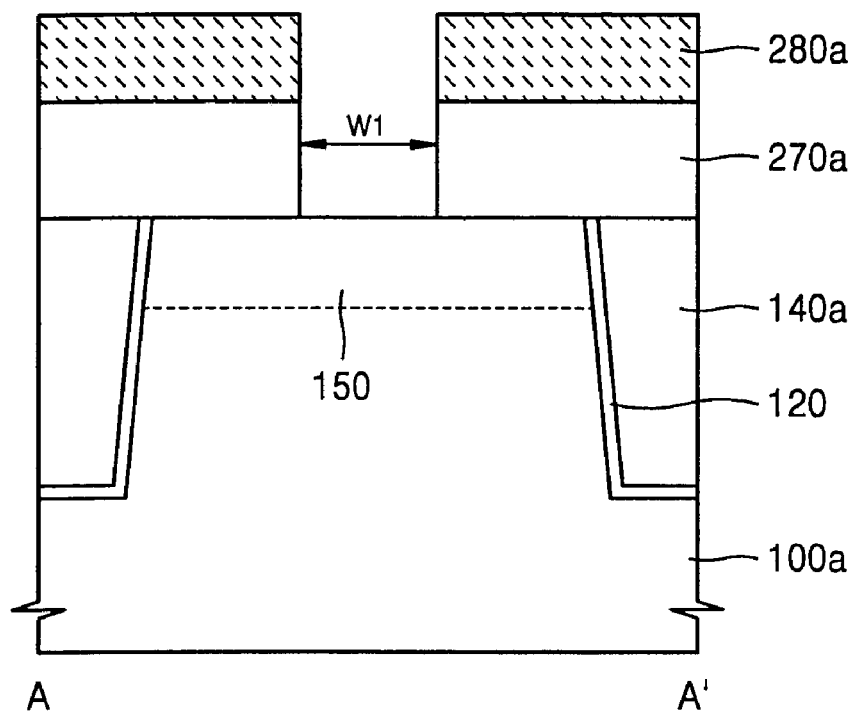
Figure 17B:
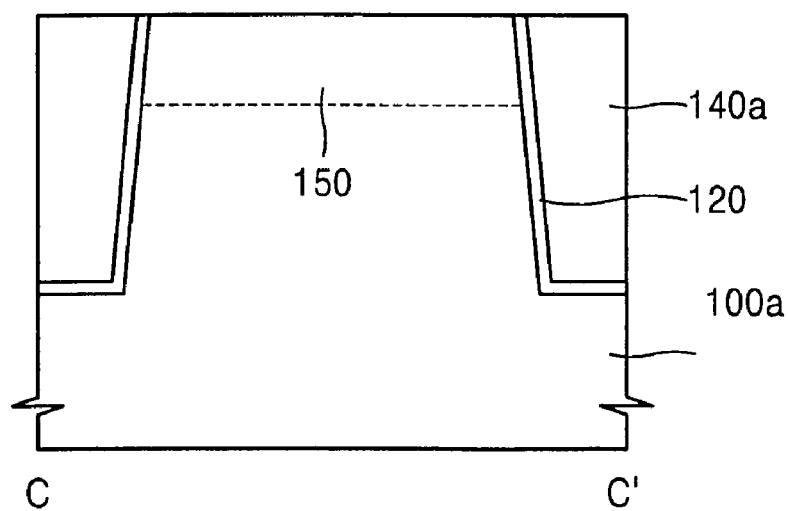

Referring to FIGS. 17A and 17B, a photoresist pattern 280a that defines a gate trench is formed using an exposing and a developing process. In this case, the photoresist pattern 280a can be formed in a line-type pattern which extends in a lengthwise direction (C-C' direction) which is the same direction as that of a gate electrode which will be formed in a subsequent process. A width w1 of the photoresist pattern 280a can be narrower than that of a gate trench 290 that will be formed in a subsequent process, or they can also be formed to the same width. The latter case is depicted in the drawing. When the width w1 of the photoresist pattern 280a is formed to be equivalent or similar to the width of the gate trench 290, a process for forming a spacer, which will be described later, is required.

In this case, the width w1 of the gate trench 290, which is defined by a mask pattern 270a, is formed to about 50~100 nm. On the other hand, when the width w1 of the photoresist pattern 280a is narrower than that of the gate trench 290, a process for forming a spacer is unnecessary but an exposing process becomes complicated due to a limitation of the exposing process.

Afterward, the mask pattern 270a is formed by pattering the insulating film 270 by anisotropic dry etching using the photoresist pattern 280a as an etch mask. Also, the mask pattern 270a is formed in a line-type pattern extending along the length direction. A channel sub-region of the active region and a trench device isolation region 140a adjacent to the channel sub-region are exposed by the mask pattern 270a.

Figure 18A:
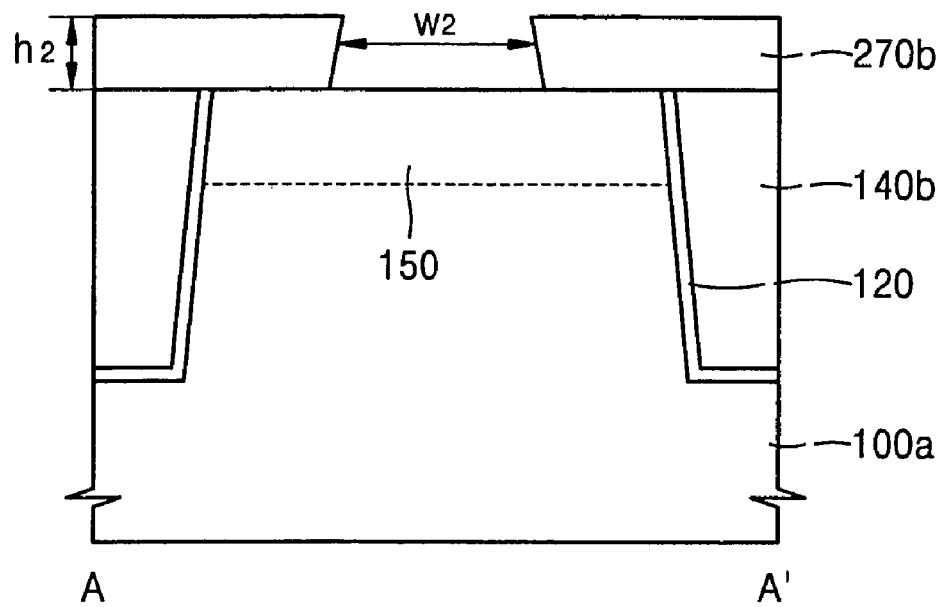
Figure 18B:
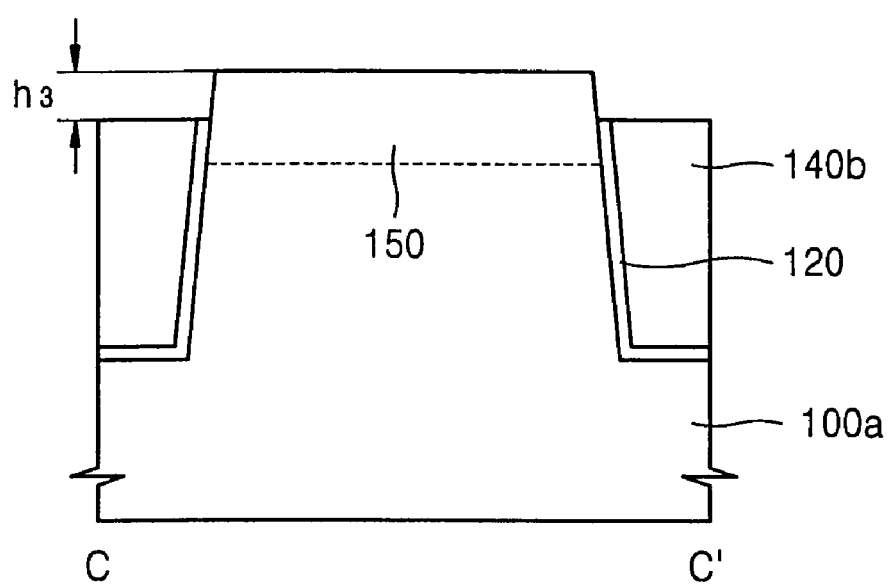

Referring to FIGS. 18A and 18B, after removing the photoresist pattern 280a, a recessed STI region 140b is formed by etching a portion of the STI region 140a, i.e., the device isolation region, exposed by the mask pattern 270a using an isotropic etching process, such as a chemical dry etch (CDE) process or a wet etching process. The active region protrudes higher than the recessed STI region 140b. In this case, when the mask pattern 270a does not have an etch selectivity over the STI region 140a, the mask pattern 270a can also be etched as much as a depth h3 to which the STI region 140a is etched. Also, the width w2 of the mask pattern 270a becomes about two times greater than the etch depth h3 because isotropic etching is used. As a result, a height h2 of the remaining mask pattern 270b is equal to the recessed depth h3 of the STI 140a subtracted from the initial height h1 of the mask pattern 270a. As a result, a portion of side surfaces of the active region 100a in which a gate trench will be formed is exposed by the mask pattern 270a and the recessed STI region 140b.

When an isotropic etching process such as wet etching is used to form the mask pattern 270a, there is an advantage in that protruded edges of the active region, that is, adjacent portions of the recessed STI region 140b, can not be easily damaged by physical impact. A Low Ammonium fluoride Liquid (LAL) or a Buffer Oxide Etchant (BOE) may be used in the wet etching process.

In the process for forming the recessed STI region 140b, an etching depth of the STI region 140b is preferably determined according to a depth of the gate trench 290, which will be formed in a subsequent process, and an etch profile of a bottom of the gate trench. It is preferable that the insulating film is etched to a depth of about 300~500 Å when the gate trench is formed to a depth of about 1500 Å.

Figure 19A:
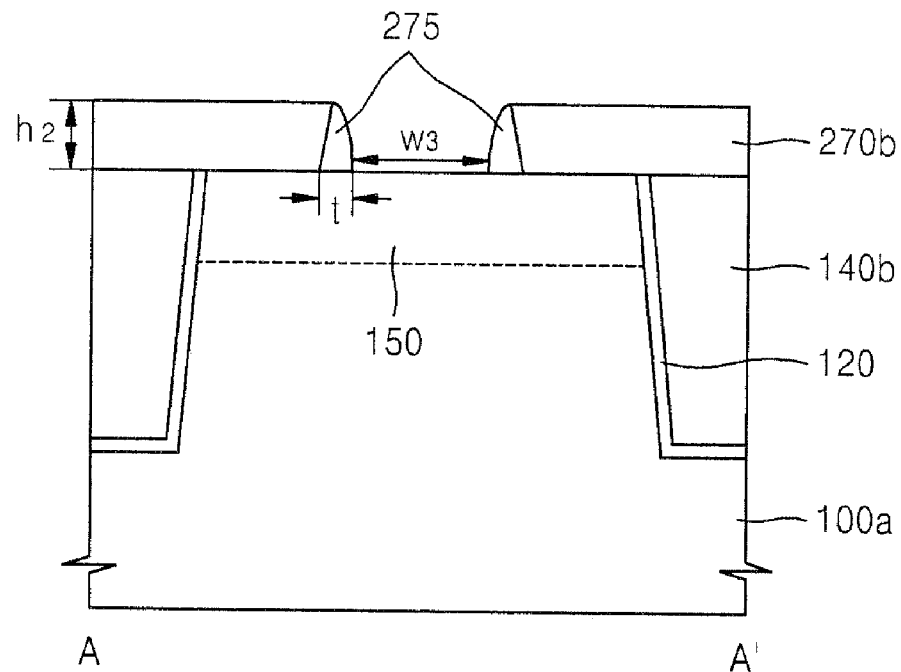
Figure 19B:
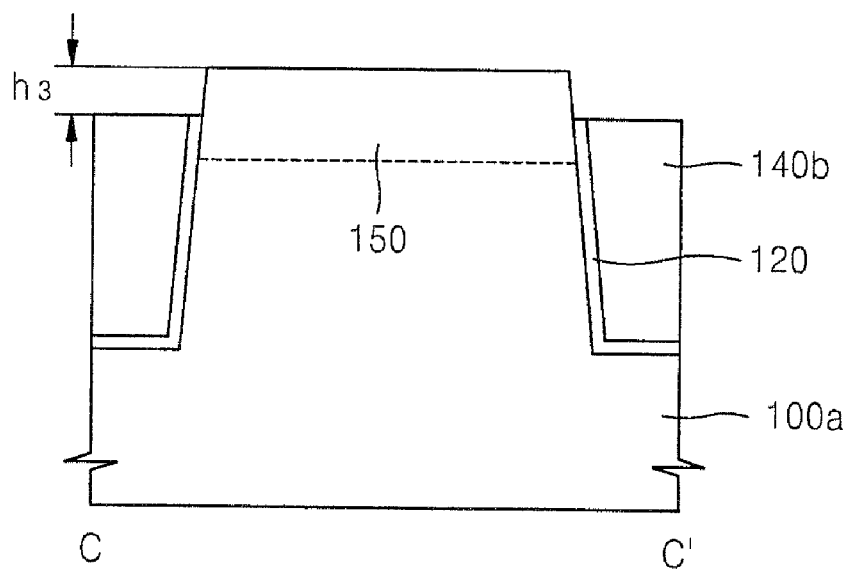

Referring to FIGS. 19A and 19B, spacers 275 are formed on side walls of the mask pattern 270a. The process for forming the spacer 275 is optional when the width w2 of the widened mask pattern 270a is wider than a width of the gate trench 290 to be formed in a subsequent process. The spacer 275 is preferably formed of a material having a large etch selectivity with respect to the silicon substrate 100a. The spacer 275 can be formed of an insulating material such as silicon oxide or silicon nitride. A thickness t of the spacer 275 can be determined according to a width of the gate trench 290 to be formed in a subsequent process. That is, a width w3 defined by the mask pattern 270a and the spacer 275 is determined to be the width of the gate trench 290.

Figure 20A:
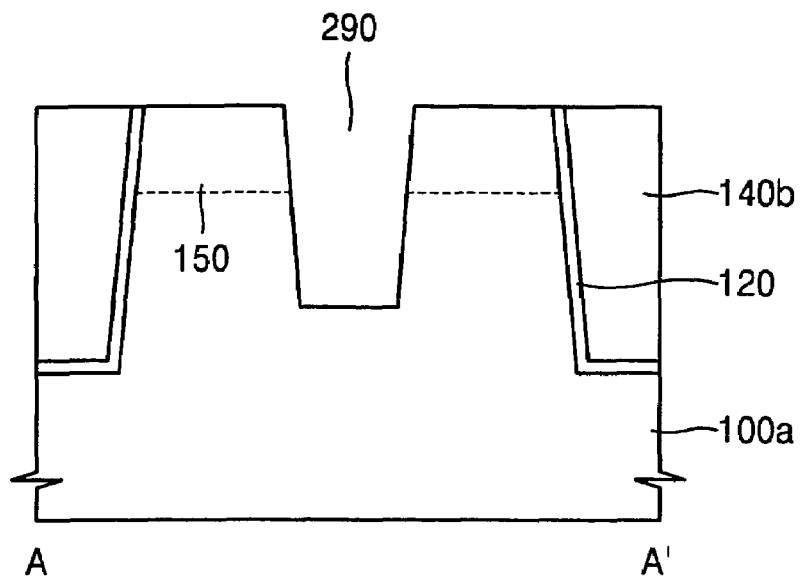
Figure 20B:
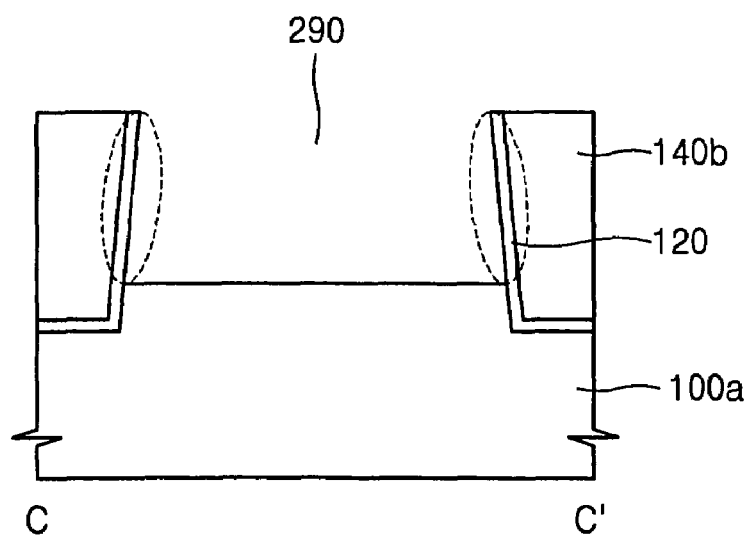

Referring to FIGS. 20a and 20b, the gate trench 290 is formed by anisotropic dry etching of the exposed substrate 100a using the mask pattern 270a and the spacer 275 as an etch mask. The gate trench 290 is formed to a depth greater than a depth of the source/drain region 150. Preferably, the gate trench 290 is formed to a depth of about 1500 Å. For forming the gate trench 290, the polysilicon or silicon can be etched by reactive ion etching (RIE) using an etching gas such as HBr, $Cl_2$, $CClF_3$, $CCl_4$, or $SF_6$, which has a large etch selectivity for the mask pattern 270a and the spacer 275. A preferred etching gas is a mixture of HBr and $Cl_2$.

As mentioned above, a portion of the substrate 100a protrudes from the recessed STI 140b, thus the upper sides of the substrate 100a are exposed by the recessed STI 140b.

Therefore, when forming the gate trench 290, the upper surface of the protruded portion of the substrate 100 and the exposed side surfaces of the substrate 100 are etched at the same time. In the conventional process, the etching progresses only on the upper surface in a vertical direction. However, according to embodiments of the invention etching also progresses on the upper portion of the side surfaces of the substrate 100. As a result, in the early stage of etching for forming the gate trench 290, a boundary region (dotted circle regions in FIG. 20b) of the gate trench 290 near a side wall of the STI 140b is etched deeper than a central region of the gate trench 190.

When the etching is continued, a height of the substrate 100a is lower than that of the recessed STI region 140b. After a predetermined process of etching to form the gate trench 290, a planarized bottom profile of the gate trench 290 is formed.

The etching is stopped when a planarized bottom profile of the gate trench 190 is achieved. Unlike the conventional process, a silicon fence between a side wall of the gate trench 290 and a side wall of the recessed STI region 140b is not formed, and channel lengths of the entire region of the gate trench 290 are uniform because the bottom of the gate trench 290 is planarized. The recessed depth h3 (in the second embodiment, 300~500 Å) of the STI region 140a etched in the process for forming the recessed STI 140b, which is described with reference to the drawings 18A and 18B, is determined to be a depth at which the bottom profile of the gate trench 290 becomes practically planarized when the gate trench 290 reaches a target depth (in the second embodiment, 1,500 Å).

Figure 21A:
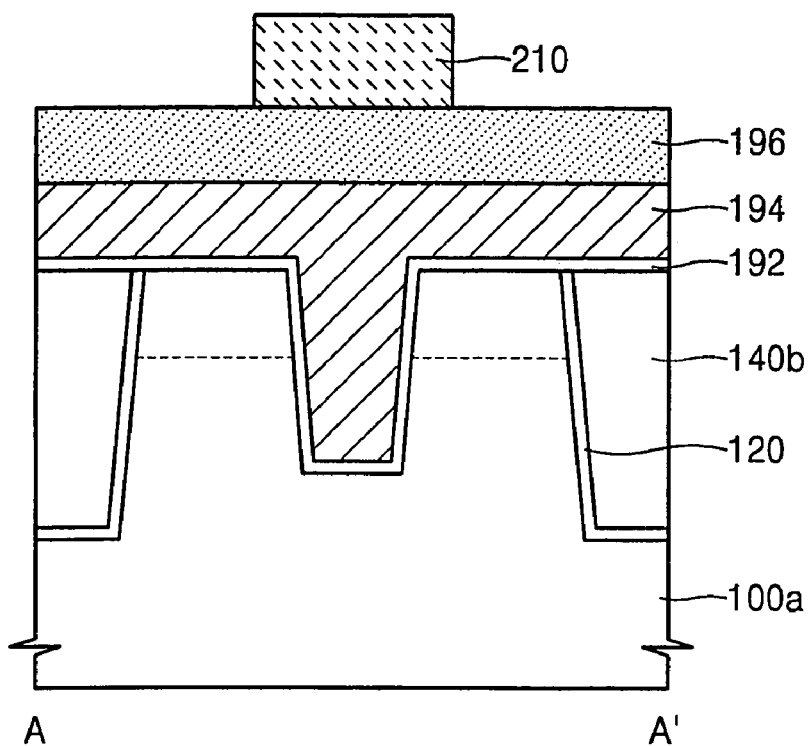
Figure 21B:
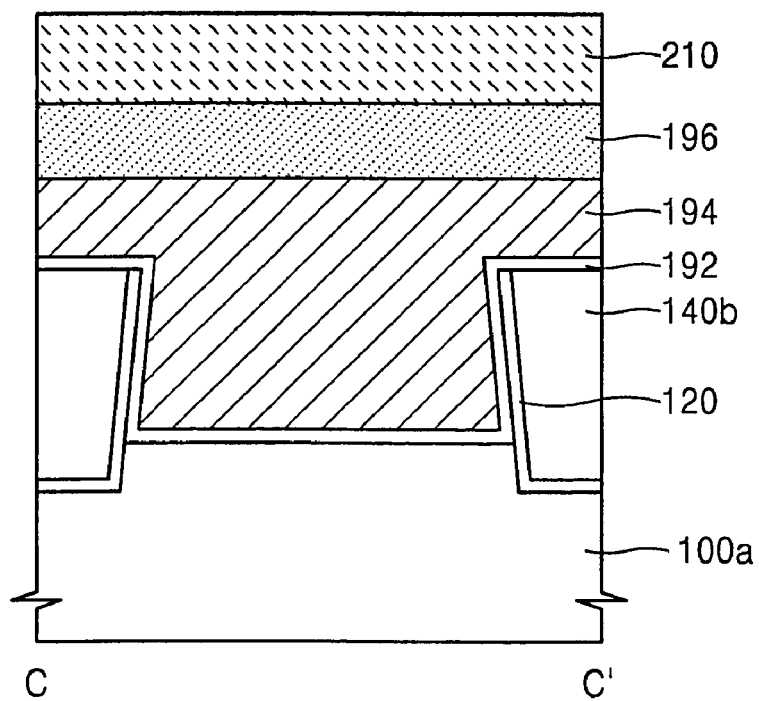

Referring to FIGS. 21A and 21B, a gate oxide film 192 is formed after removing the mask pattern 270b. The mask pattern 270b can be removed using diluted hydrogen fluoride (HF) or a buffer oxide etchant (BOE). The gate oxide film 192 may be formed to a thickness of about 40 Å or less. The gate oxide film 192 can be formed by dry oxidation using oxygen at a temperature of 1000~1100° C., by wet oxidation using vapor at temperature of 1000~1100° C., HCl oxidation using a gaseous mixture of oxygen and HCl, by oxidation using a gaseous mixture of oxygen and $C_2H_3Cl_3$, or by oxidation using a gaseous mixture of oxygen and $C_2H_2Cl_2$. Next, the gate trench 190 is filled by forming a gate electrode conductive film 194. The gate electrode conductive film 194 may be a doped polysilicon film, a metal film, a sequentially deposited doped polysilicon film and a metal film, or a sequentially deposited doped polysilicon film and metal silicide film. The metal film can be formed of a metal selected from the group consisting of tungsten, cobalt, and nickel, and the metal silicide can be formed of a tungsten silicide film or a cobalt silicide film. The doped polysilicon film may be formed by LPCVD using $SiH_2Cl_2$ and $PH_3$ gas. The tungsten silicide film may be formed by LPCVD using $SiH_2Cl_2$ and $WF_6$ gas. A nitride film 196 is formed on the gate electrode conductive film 194. An ARC (not shown) and a photoresist pattern 210 that defines a gate electrode are formed on the nitride film 196.

Figure 22A:
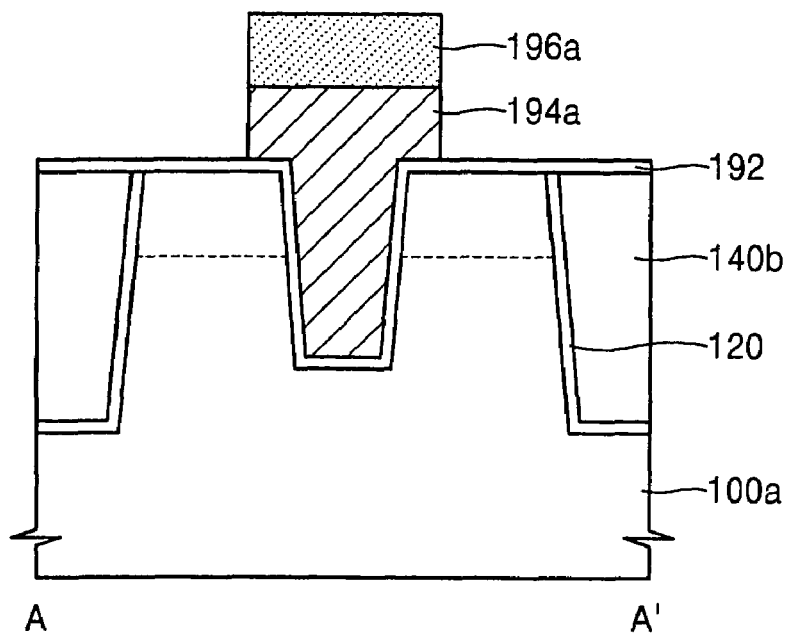
Figure 22B:
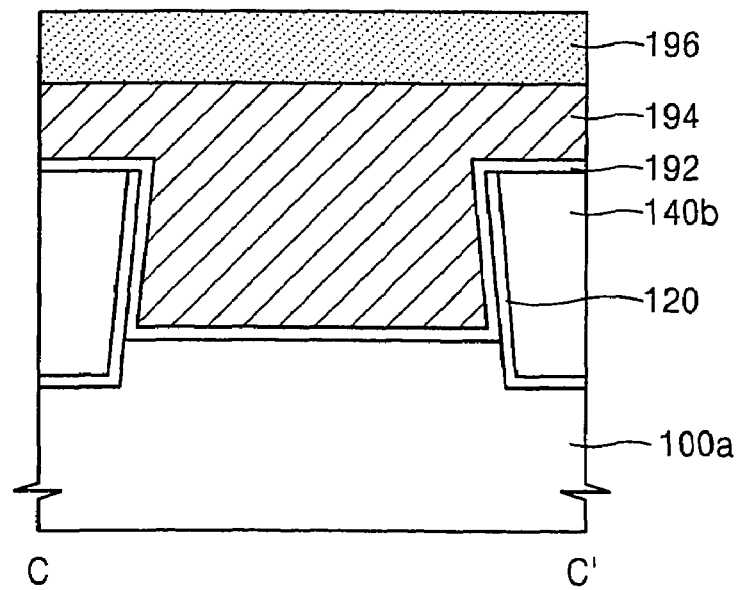

Referring to FIGS. 22A and 22B, gate electrodes 194a and 196a are formed by sequentially etching the ARC, the nitride film 196, and the gate electrode conductive film 194 by dry etching using the photoresist pattern 210 as an etch mask. Then, the photoresist pattern 210 is removed.

The manufacturing of the integrated circuit device is then completed using conventional processes for forming an integrated circuit device.

According to the exemplary embodiments of the invention, a recessed transistor of an integrated circuit device has the same channel length regardless of the locations in the active region, and the presence of a silicon fence in the gate trench may be prevented. Accordingly, a reduced threshold voltage and an increased sub-threshold leakage current due to a short channel effect, which is caused by a remaining substrate region, of the transistor at an edge of the active region, are prevented.

Also according to embodiments of the invention, a recessed transistor of an integrated circuit device that has the above advantages may be manufactured without an additional isotropic dry etching process or a wet etching process, thereby simplifying a manufacturing process and reducing production costs.

Also, according to a method of manufacturing a recessed channel transistor of an integrated circuit device according to embodiments of the invention, since the recessed STI is formed lower than an active region using isotropic etching such as wet etching, the active region close to the STI region is not damaged by a physical impact, thereby increasing the reliability of the transistor.

The invention may be practiced in many ways. What follows are exemplary, non-limiting descriptions of some embodiments of the invention.

According to some embodiments of the invention, there is provided a method of manufacturing an integrated circuit device that includes a recessed transistor including defining an active region by forming a trench device isolation region on an integrated circuit substrate, forming a mask pattern on the integrated circuit substrate that exposes a channel sub-region of the active region and the trench device isolation region adjacent to the channel sub-region, etching the trench device isolation region, which is exposed by the mask pattern, to be recessed to a first depth using the mask pattern as an etch mask, etching the channel sub-region to form a gate trench having a second depth that is deeper than the first depth using the mask pattern as an etch mask, and forming a recess gate that fills the gate trench.

According to other embodiments of the invention, there is provided a method of manufacturing an integrated circuit device that includes a recessed transistor, including defining an active region by forming a trench device isolation region on an integrated circuit substrate, forming a mask pattern that exposes a channel sub-region of the active region and the trench device isolation region adjacent to the channel sub-region, anisotropic dry etching the trench device isolation region, which is exposed by the mask pattern, to be recessed to a first depth using the mask pattern as an etch mask, anisotropic dry etching the channel sub-region to form a gate trench having a second depth that is deeper than the first depth using the mask pattern as an etch mask, and forming a recess gate that fills the gate trench.

According to other embodiments of the invention, a method of manufacturing an integrated circuit device that includes a recessed transistor, includes defining an active region by forming a trench device isolation region on an integrated circuit substrate, forming a mask pattern that exposes a channel sub-region of the active region and the trench device isolation region adjacent to the channel sub-region, isotropic etching the trench device isolation region, which is exposed by the mask pattern, to be recessed to a first depth using the mask pattern as an etch mask, anisotropic dry etching the channel sub-region to form a gate trench having a second depth that is deeper than the first depth, using the mask pattern as an etch mask, and forming a recess gate that fills the gate trench.

According to other embodiments of the invention, a method of manufacturing an integrated circuit device that includes a recessed transistor, includes defining an active region by forming a trench device isolation region on an integrated circuit substrate, forming a line-type mask pattern that exposes a channel sub-region of the active region and the trench device isolation region adjacent to the channel sub-region, isotropic etching the exposed trench device isolation region to be recessed below the active region using the mask pattern as an etch mask, forming a spacer on a side wall of the mask pattern, etching the channel sub-region to form a gate trench using the mask pattern and the spacer as an etch mask, and forming a recess gate that fills the gate trench.

While the invention has been particularly shown and described with reference to exemplary embodiments thereof, it will be understood by those skilled in the art that various changes in form and details may be made therein without departing from the spirit and scope of the invention as defined by the appended claims.

The invention claimed is:

1. A method of manufacturing an integrated circuit device comprising:
    defining an active region by forming a trench device isolation region on an integrated circuit substrate;
    forming a mask pattern that exposes a channel sub-region of the active region and the trench device isolation region adjacent to the channel sub-region;
    etching the trench device isolation region exposed by the mask pattern using the mask pattern as an etch mask to form a recessed trench device isolation region, wherein a side surface of the channel sub-region is exposed by the recessed trench device isolation region;
    etching the channel sub-region and the exposed side surface of the active region to form a gate trench using the mask pattern as an etch mask; and
    forming a recess gate that fills the gate trench.

2. The method of claim 1, wherein etching the channel sub-region to form the gate trench comprises anisotropically dry etching.

3. The method of claim 2, wherein etching the channel sub-region to form the gate trench further comprises:
    etching an edge portion of the channel sub-region adjacent to the recessed trench device isolation region, such that the edge portion of the channel sub-region has a deeper etch profile than a central region of the sub-channel region; and etching the central region and the edge portion so that the central region and the edge portion have a substantially flat etch profile.

4. The method of claim 1, wherein forming the mask pattern comprises forming a line-type pattern.

5. The method of claim 4, wherein forming the mask pattern further comprises:
sequentially depositing an oxide film, a polysilicon film, and a photoresist film on the integrated circuit substrate on which the active region is defined;
exposing and developing the photoresist film to form a photoresist pattern for forming the gate trench;
etching the polysilicon film and the oxide film using the photoresist pattern as an etch mask to form a polysilicon film pattern and an oxide film pattern; and
removing the photoresist pattern to form the mask pattern.

6. The method of claim 5, wherein etching the channel sub-region to form the gate trench further comprises etching the polysilicon film pattern and the channel sub-region simultaneously.

7. A method of manufacturing an integrated circuit device comprising:
defining an active region by forming a trench device isolation region on substrate;
forming a mask pattern that exposes a channel sub-region of the active region and the trench device isolation region adjacent to the channel sub-region;
anisotropically dry etching the trench device isolation region exposed by the mask pattern to a first depth using the mask pattern as an etch mask to form a recessed trench device isolation region;
after forming the recessed trench device isolation region, anisotropically dry etching the channel sub-region to form a gate trench having a second depth that is deeper than the first depth using the mask pattern as an etch mask; and
forming a recess gate that fills the gate trench.

8. The method of claim 7, wherein anisotropically dry etching the channel sub-region to form the gate trench comprises:
etching an edge portion of the channel sub-region adjacent to the recessed trench device isolation region, such that the edge portion of the channel sub-region has a deeper etch profile than a central region of the sub-channel region; and
etching the central region and the edge portion so that the central region and the edge portion have a substantially flat etch profile.

9. The method of claim 7, wherein forming the mask pattern comprises sequentially forming an oxide film pattern and a polysilicon film pattern on the oxide film pattern.

10. The method of claim 9, wherein forming the mask pattern further comprises forming a line type pattern.

11. The method of claim 9, wherein anisotropically dry etching the trench device isolation region comprises etching with an etch gas that has a large etch selectivity for the polysilicon film pattern.

12. The method of claim 1, further comprising forming a source/drain region in the active region before forming the gate trench, wherein the gate trench is formed deeper than a depth of the source/drain region.

13. A method of manufacturing an integrated circuit device comprising:
defining an active region by forming a trench device isolation region on an integrated circuit substrate;
forming a mask pattern that exposes a channel sub-region of the active region and the trench device isolation region adjacent to the channel sub-region;
isotropically etching the trench device isolation region to a first depth using the mask pattern as an etch mask;
anisotropically dry etching the channel sub-region, using the mask pattern as an etch mask, to form a gate trench having a second depth that is deeper than the first depth; and
filling the gate trench with a recess gate.

14. The method of claim 13, wherein forming the mask pattern comprises forming the mask pattern of the same material as the trench device isolation region.

15. The method of claim 14, wherein forming the mask pattern further comprises forming the mask pattern of silicon oxide.

16. The method of claim 14 wherein forming the mask pattern further comprises forming the mask pattern to be thicker than a depth by which trench device isolation region is recessed.

17. The method of claim 13, wherein forming the mask pattern comprises forming a line type pattern.

18. The method of claim 17, wherein forming the mask pattern further comprises forming the mask pattern to a narrower width than a width of the gate trench.

19. The method of claim 1, wherein etching the trench device isolation region comprises etching the trench device isolation region to a first depth using the mask pattern as an etch mask and wherein etching the channel sub-region to form the gate trench using the mask pattern as an etch mask comprises etching the channel sub-region to form a gate trench having a second depth that is deeper than the first depth.

20. A method of manufacturing an integrated circuit device comprising:
defining an active region by forming a trench device isolation region on an integrated circuit substrate;
forming a mask pattern that exposes a channel sub-region of the active region and the trench device isolation region adjacent to the channel sub-region;
etching the trench device isolation region exposed by the mask pattern using the mask pattern as an etch mask to form a recessed trench device isolation region;
etching the channel sub-region to form a gate trench using the mask pattern as an etch mask; and
forming a recess gate that fills the gate trench,
herein etching the channel sub-region to form the gate trench comprises:
etching an edge portion of the channel sub-region adjacent to the recessed trench device isolation region, such that the edge portion of the channel sub-region has a deeper etch profile than a central region of the sub-channel region; and
etching the central region and the edge portion so that the central region and the edge portion have a substantially flat etch profile.

* * * * *

UNITED STATES PATENT AND TRADEMARK OFFICE
CERTIFICATE OF CORRECTION

PATENT NO.         : 7,326,619 B2                                    Page 1 of 1
APPLICATION NO. : 10/902642
DATED              : February 5, 2008
INVENTOR(S)        : Jong-Chul Park et al.

It is certified that error appears in the above-identified patent and that said Letters Patent is hereby corrected as shown below:

In the Drawings   Delete: "Sheet 3/22"
                    Insert:

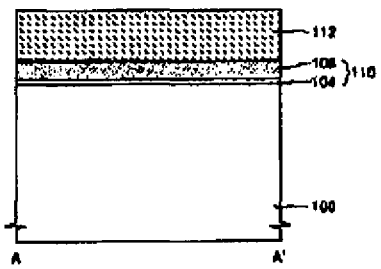

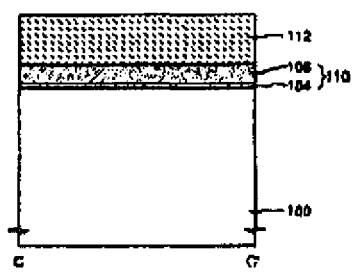

Signed and Sealed this

Twenty-second Day of December, 2009

David J. Kappos
*Director of the United States Patent and Trademark Office*